United States Patent
Kitagawa et al.

(10) Patent No.: US 8,750,029 B2
(45) Date of Patent: Jun. 10, 2014

(54) MAGNETORESISTIVE EFFECT ELEMENT AND MAGNETIC MEMORY

(75) Inventors: Eiji Kitagawa, Yokohama (JP); Tadaomi Daibou, Yokohama (JP); Tadashi Kai, Tokyo (JP); Toshihiko Nagase, Yokohama (JP); Katsuya Nishiyama, Yokohama (JP); Koji Ueda, Kamakura (JP); Hiroaki Yoda, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 441 days.

(21) Appl. No.: 13/233,420

(22) Filed: Sep. 15, 2011

(65) Prior Publication Data
US 2012/0068284 A1  Mar. 22, 2012

(30) Foreign Application Priority Data
Sep. 17, 2010 (JP) ................................ 2010-210183

(51) Int. Cl.
*G11C 11/15* (2006.01)
*H01L 43/08* (2006.01)
(52) U.S. Cl.
USPC ...... 365/158; 365/171; 257/421; 257/E43.004
(58) Field of Classification Search
CPC ....... H01L 43/08; H01L 43/10; H01L 27/222; H01L 29/82; G11C 11/16; G11C 11/161
USPC .......... 257/421, E43.004, E47.001, E27.005, 257/E29.323; 365/158, 171
See application file for complete search history.

(56) References Cited

U.S. PATENT DOCUMENTS

| | | | |
|---|---|---|---|
| 7,663,197 B2 * | 2/2010 | Nagase et al. | 257/421 |
| 7,768,824 B2 | 8/2010 | Yoshikawa et al. | |
| 8,072,800 B2 * | 12/2011 | Chen et al. | 365/158 |
| 2009/0079018 A1 | 3/2009 | Nagase et al. | |
| 2009/0080239 A1 * | 3/2009 | Nagase et al. | 365/158 |
| 2009/0257151 A1 | 10/2009 | Zhang et al. | |

FOREIGN PATENT DOCUMENTS

| | | |
|---|---|---|
| JP | 2009/081216 | 4/2009 |
| JP | 2009-083314 | 4/2009 |

OTHER PUBLICATIONS

Japanese Office Action for corresponding Japanese Application No. 2010-210183, Mailed Aug. 7, 2012, 5 pages.
Spin transfer switching in TbCoFe/CoFeB/MgO/CoFeB/TbCoFe magnetic tunnel junctions with perpendicular magnetic anisotropy, Journal of Applied Physics 103, 07A710 (2008) Masahiko Najayama et, al.

* cited by examiner

*Primary Examiner* — Allison P Bernstein
(74) *Attorney, Agent, or Firm* — Knobbe, Martens Olson & Bear, LLP

(57) ABSTRACT

According to one embodiment, a magnetoresistive effect element includes a recording layer including ferromagnetic material with perpendicular magnetic anisotropy to a film surface and a variable orientation of magnetization, a reference layer including ferromagnetic material with perpendicular magnetic anisotropy to a film surface and an invariable orientation of magnetization, a nonmagnetic layer between the recording layer and the reference layer, a first underlayer on a side of the recoding layer opposite to a side on which the nonmagnetic layer is provided, and a second underlayer between the recording layer and the first underlayer. The second underlayer is a Pd film including a concentration of $3 \times 10^{15}$ atms/cm$^2$.

20 Claims, 15 Drawing Sheets

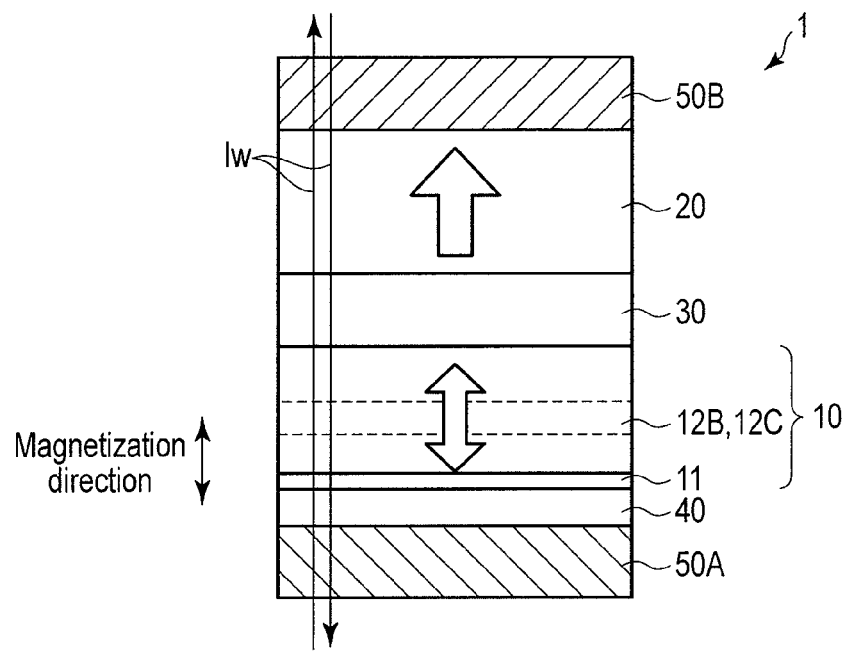
F I G. 1
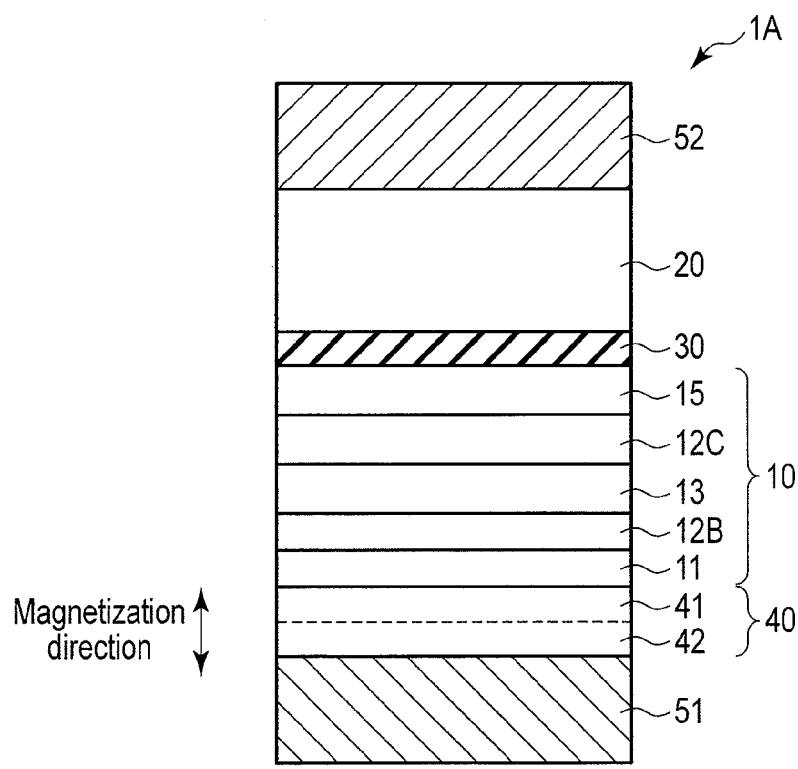
F I G. 2

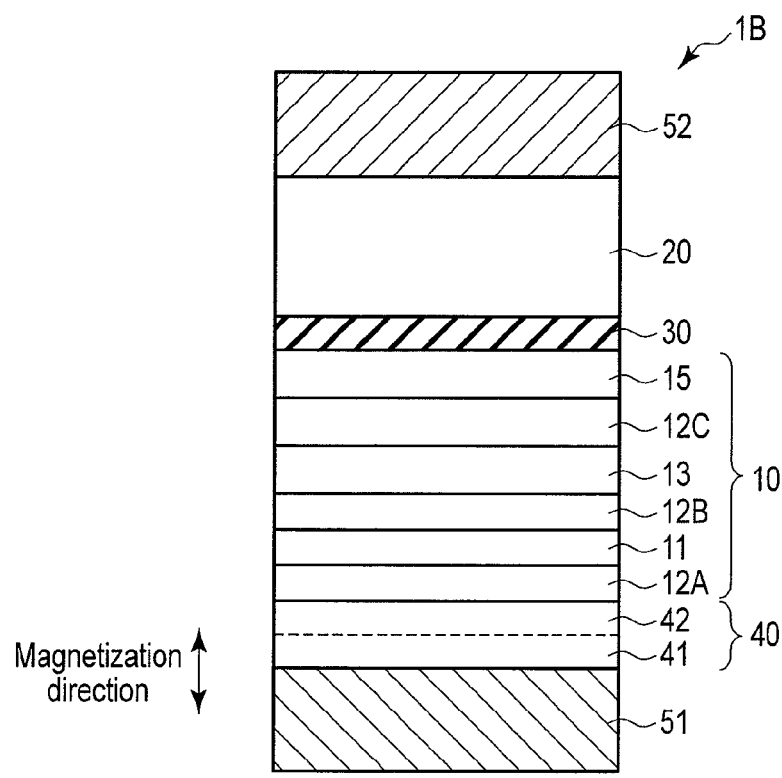
F I G. 3
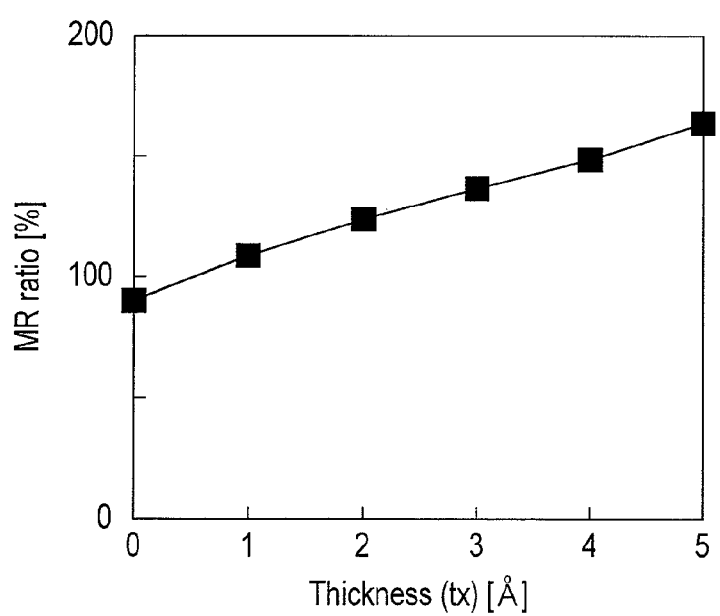
F I G. 4

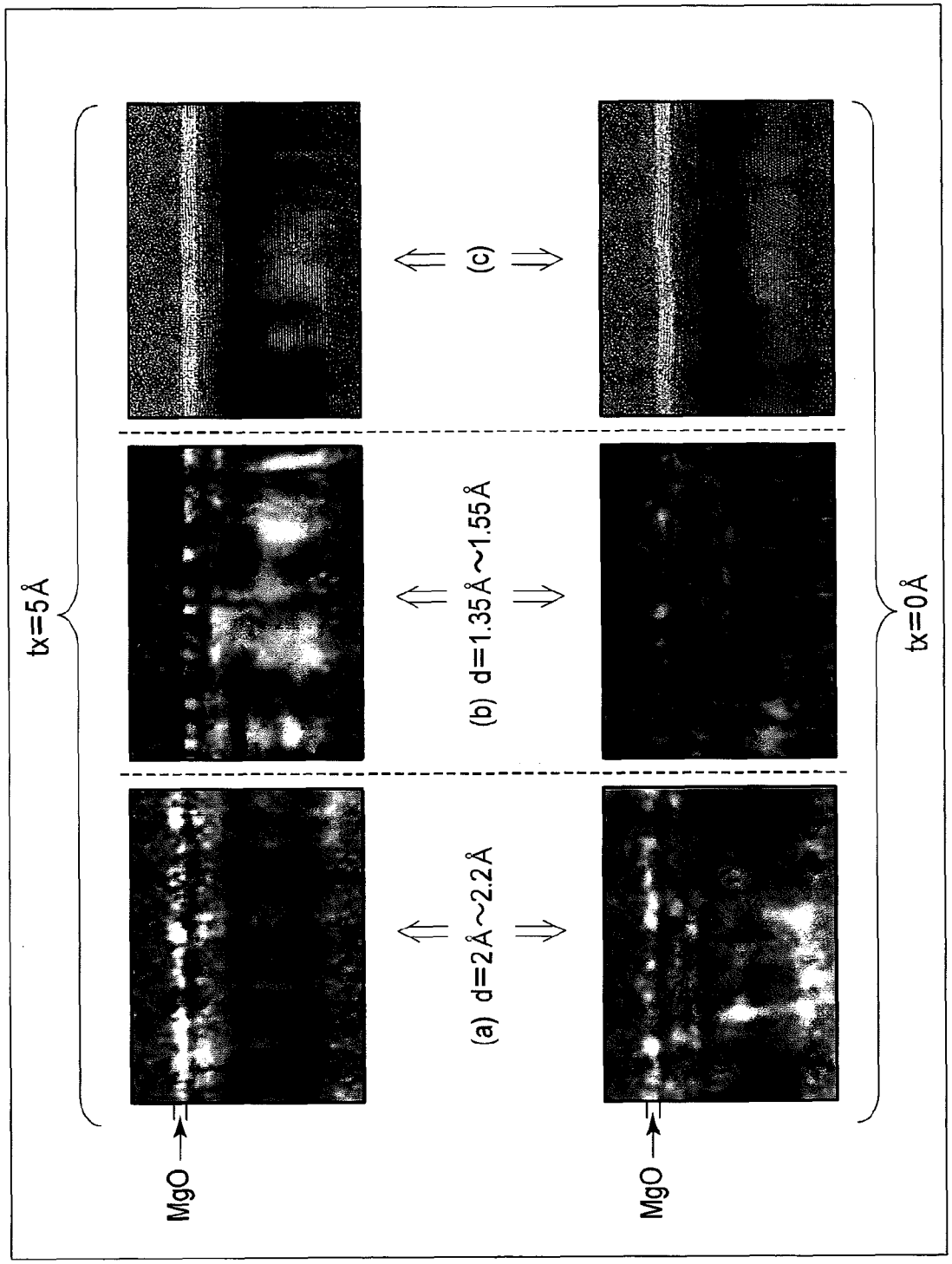
F I G. 5

| h | k | l | d [Å] | 2θ [°] | I [%] |
|---|---|---|-------|--------|-------|
| 1 | 0 | 0 | 2.17000 | 41.584 | 38.0 |
| 0 | 0 | 2 | 2.03000 | 44.600 | 63.0 |
| 1 | 0 | 1 | 1.92000 | 47.306 | 100.0 |
| 1 | 0 | 2 | 1.48000 | 62.728 | 5.0 |
F I G. 6
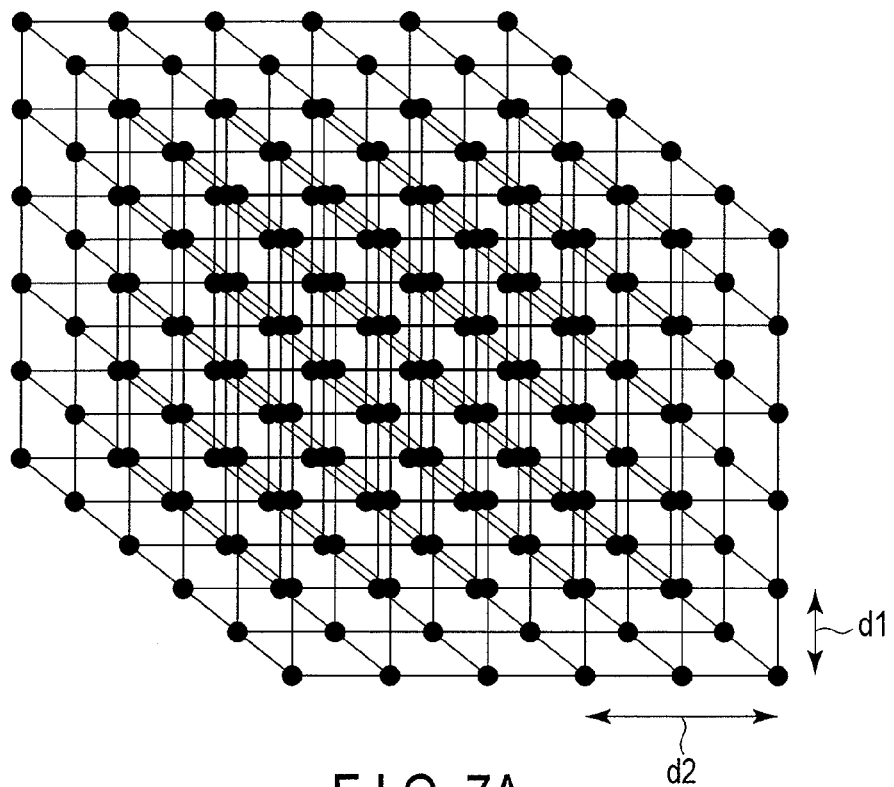
F I G. 7A

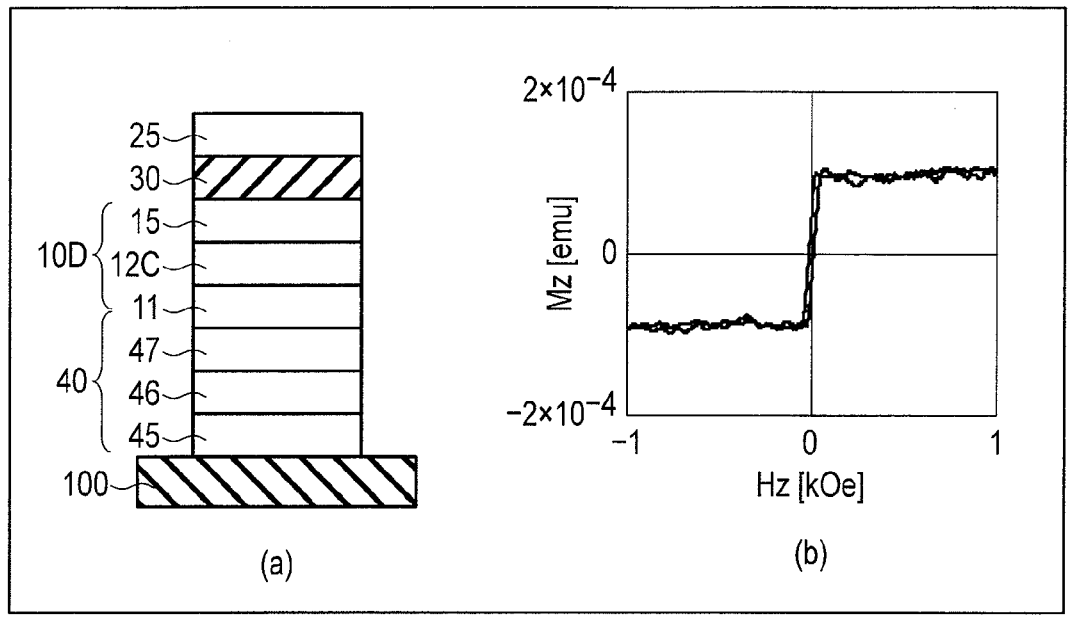
F I G. 10D
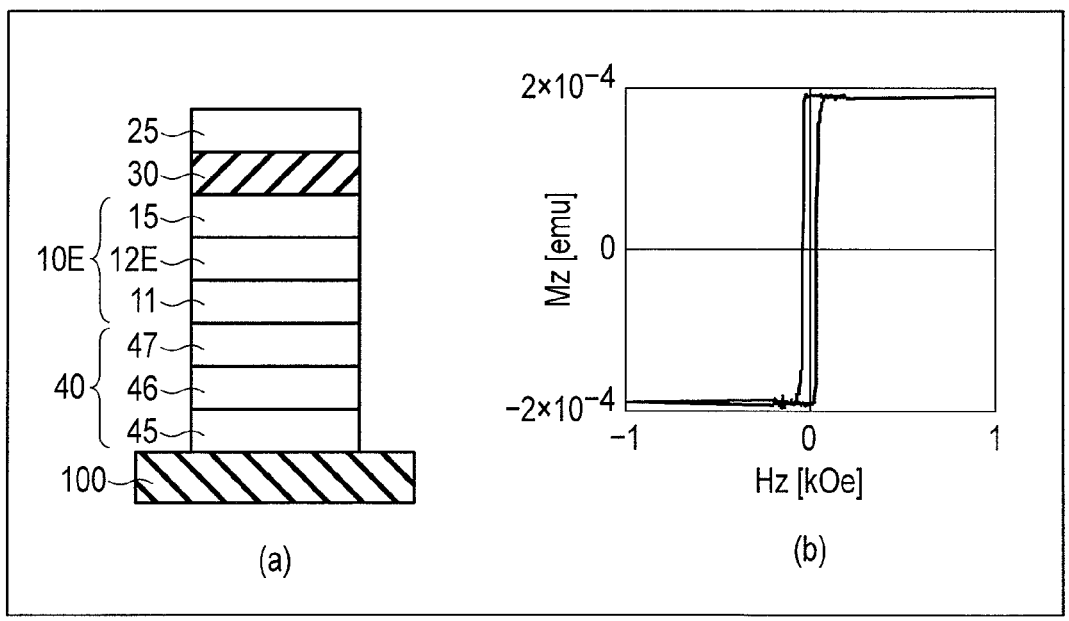
F I G. 10E

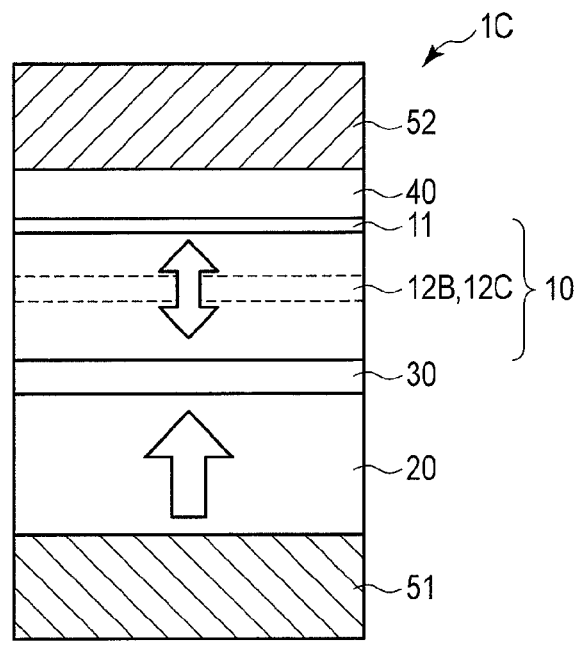
F I G. 11
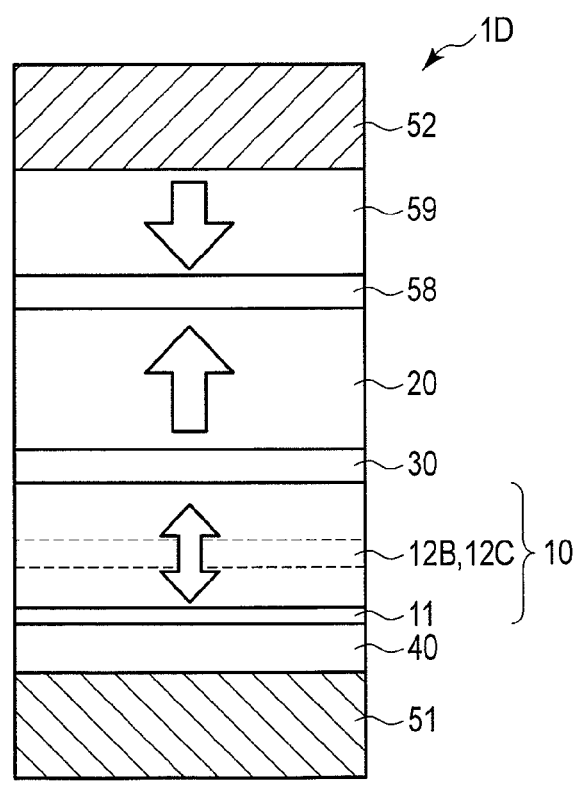
F I G. 12

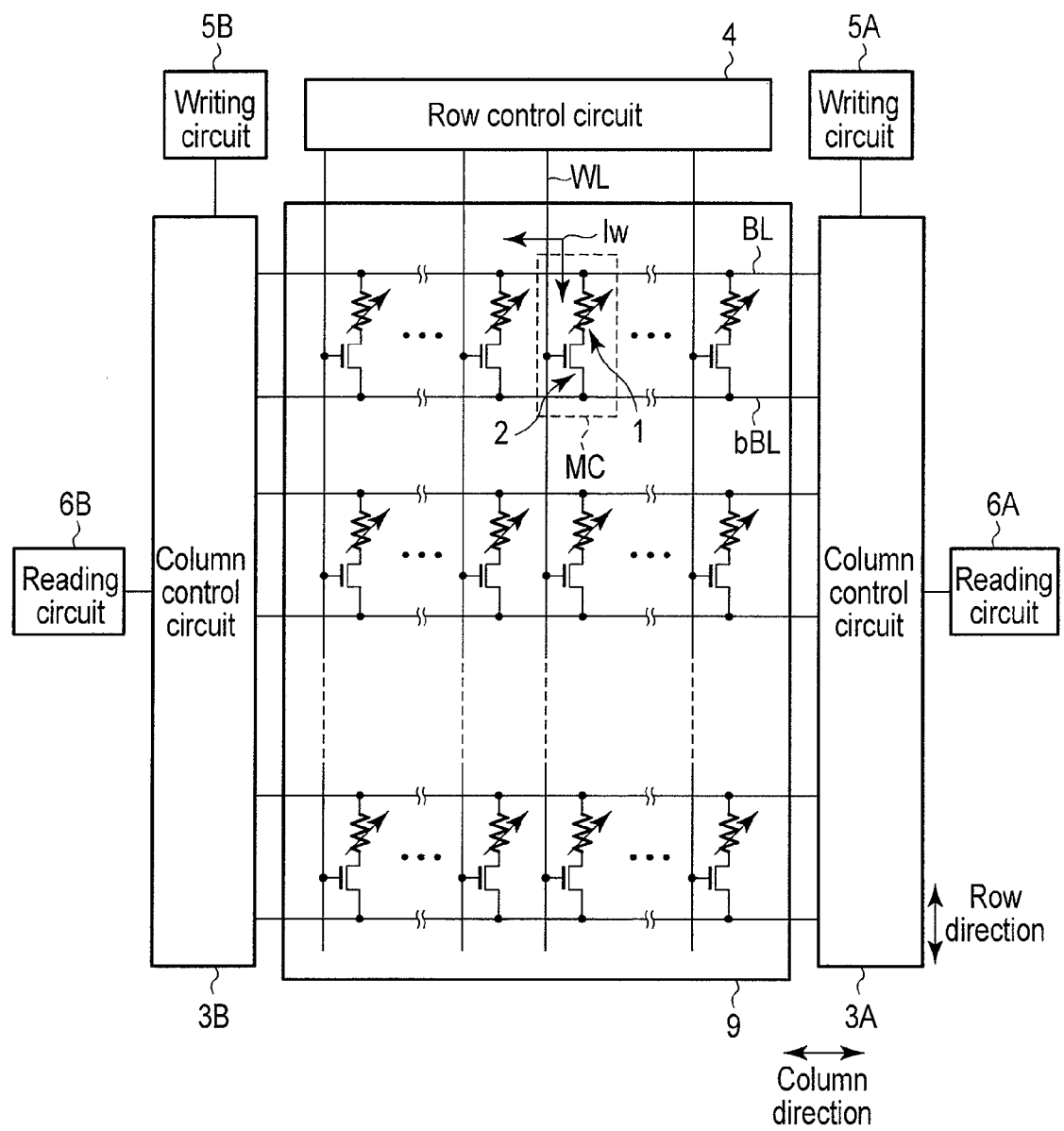
F I G. 13

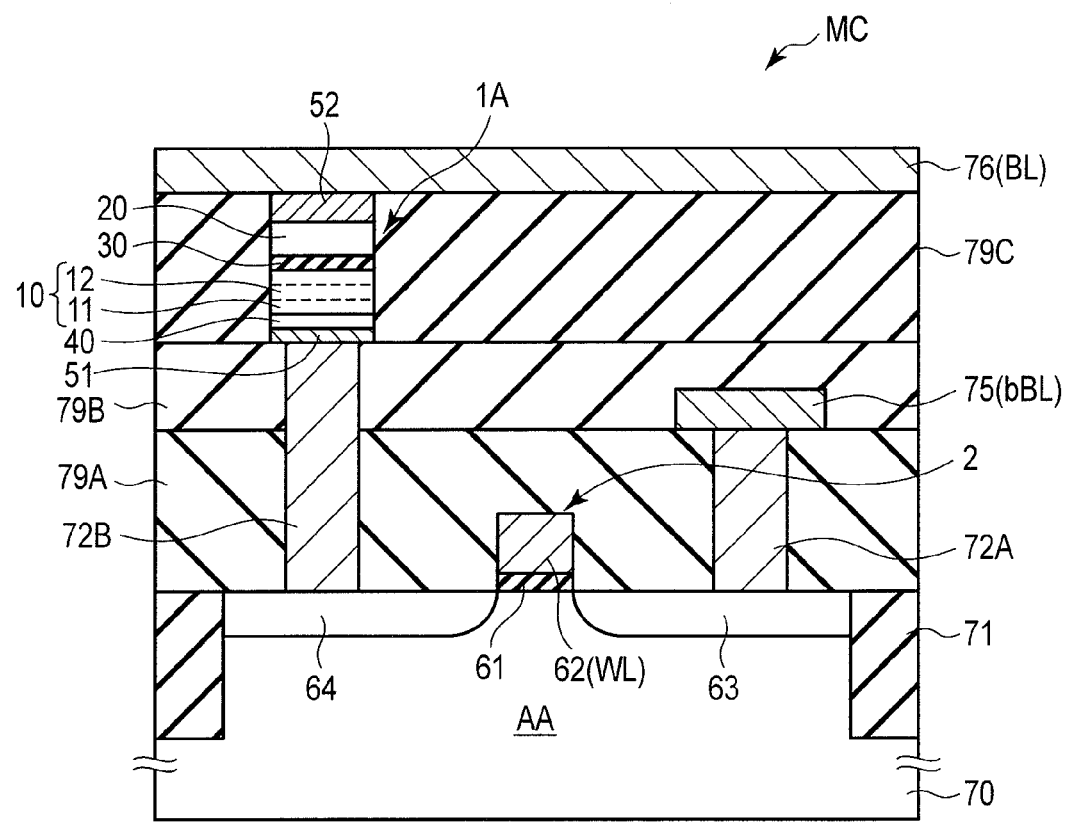
F I G. 14

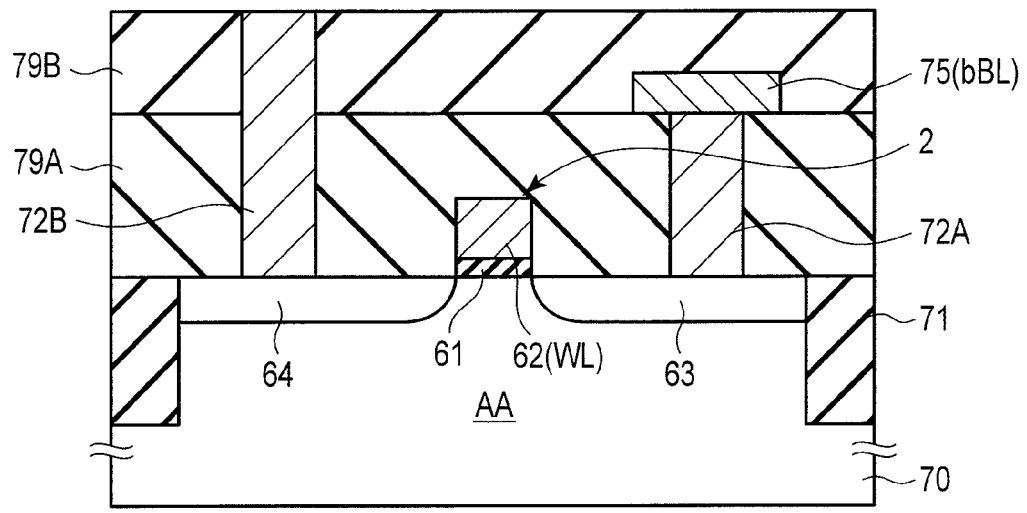
F I G. 15
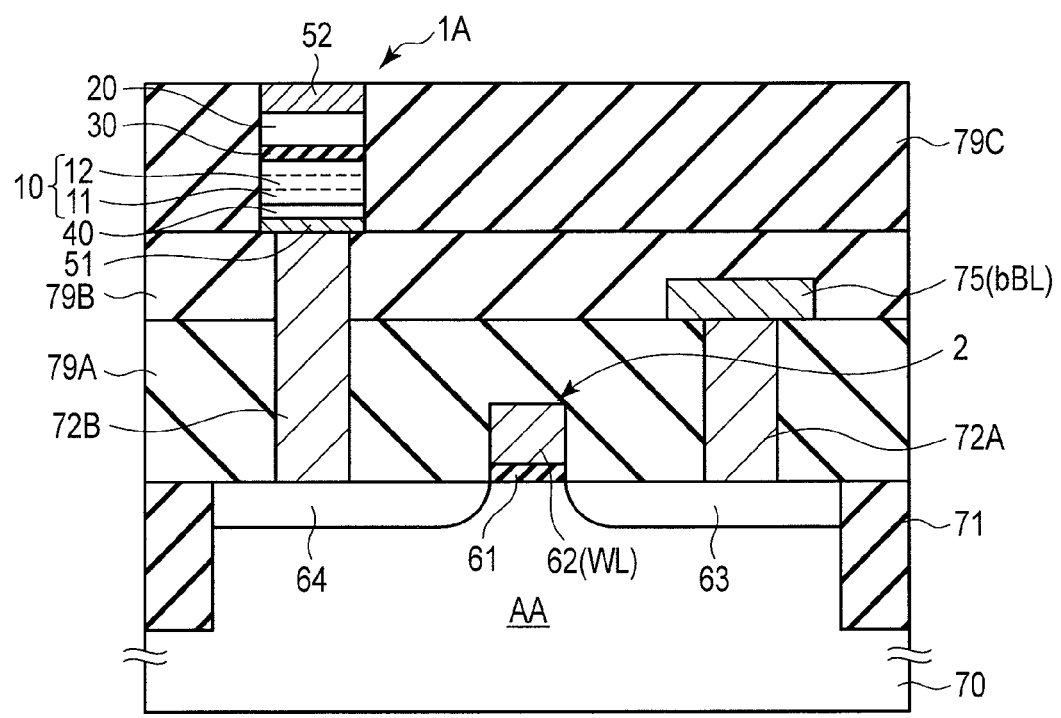
F I G. 16

MAGNETORESISTIVE EFFECT ELEMENT AND MAGNETIC MEMORY

CROSS-REFERENCE TO RELATED APPLICATIONS

This application is based upon and claims the benefit of priority from prior Japanese Patent Application No. 2010-210183, filed Sep. 17, 2010, the entire contents of which are incorporated herein by reference.

FIELD

Embodiments described herein relate generally to a magnetoresistive effect element and a magnetic memory.

BACKGROUND

A spin-transfer-torque type MRAM is expected to enable both shrinking of a cell size and reduction of a writing current.

An in-plane magnetization type magnetoresistive effect element which has been mainly studied generally utilizes shape magnetic anisotropy. In this case, in order to increase the magnetic anisotropic energy of a magnetic layer, countermeasures need to be taken of increasing an aspect ratio of a magnetoresistive effect element, increasing the film thickness of a recording layer or increasing the saturation magnetization of the recording layer. However, when characteristics of the spin-transfer-torque type are taken into account, these countermeasures cause an increase in a magnetization inversion current and therefore are not suitable for the shrinking of elements.

Further, the in-plane magnetization type magnetoresistive effect element utilizes magnetic anisotropy which is exhibited depending on a shape, and therefore a magnetization inversion current is susceptible to the variability of the shape. As a result, if the variability of the shape increases following shrinking, the variability of the inversion current increases.

By contrast with this, it is considered to use for a ferromagnetic material for forming a magnetoresistive effect element a perpendicular (vertical) magnetization film which has magnetic anisotropy in the direction perpendicular to a film surface.

In case where crystal magnetic anisotropy of a magnetic layer is utilized for a perpendicular magnetization type magnetoresistive effect element, shape anisotropy of an element (magnetic layer) is not utilized, so that it is possible to make the shape of the element smaller than the in-plane magnetization type. Further, the perpendicular magnetization type magnetoresistive effect element can reduce dispersion in an easy direction of magnetization. Hence, by adopting a material having a large crystal magnetic anisotropy, the perpendicular magnetization type magnetoresistive effect element is expected to realize both of shrinking and a lower current while maintaining thermal disturbance resistance (heat resistance).

In order to put MRAM into practical use, the element characteristics of the perpendicular magnetization type magnetoresistive effect element need to be improved. Further, the perpendicular magnetization type magnetoresistive effect element is also demanded to be resistant against a high temperature process in a manufacturing process.

BRIEF DESCRIPTION OF THE DRAWINGS

FIG. 1 is a view illustrating a basic structure of a magnetoresistive effect element according to an embodiment;

FIG. 2 is a sectional view illustrating a structure of a magnetoresistive effect element according to the first embodiment;

FIG. 3 is a sectional view illustrating a modified example of a structure of a magnetoresistive effect element according to the first embodiment;

FIG. 4 is a view illustrating an MR ratio of a magnetoresistive effect element according to the first embodiment;

FIG. 5 is a view illustrating a microscopic image of a magnetoresistive effect element according to the first embodiment;

FIG. 6 is a view for describing a crystal structure of a Co film;

FIG. 7A is a view for describing a crystal structure of a Co film;

FIG. 10D is a view illustrating magnetic characteristics of a magnetic layer;

FIG. 10E is a view illustrating magnetic characteristics of a magnetic layer;

FIG. 11 is a sectional view illustrating a structure of a magnetoresistive effect element according to the second embodiment;

FIG. 12 is a sectional view illustrating a structure of a magnetoresistive effect element according to the third embodiment;

FIG. 13 is a circuit diagram illustrating an MRAM according to an application example of embodiments;

FIG. 14 is a sectional view illustrating a structure of a memory cell of an MRAM according to an application example;

FIG. 15 is a sectional view illustrating one process of a method of manufacturing memory cells of an MRAM according to an application example; and FIG. 16 is a sectional view illustrating one process of a method of manufacturing memory cells of an MRAM according to an application example.

DETAILED DESCRIPTION

Figure 7B:
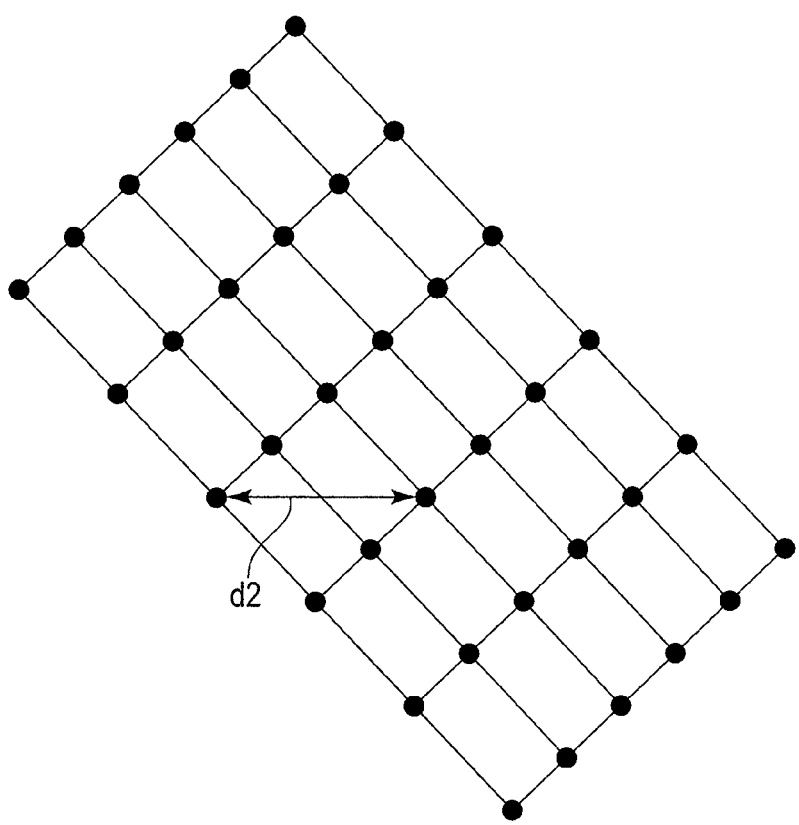
FIG. 7B is a view for describing a crystal structure of a Co film.

Hereinafter, a magnetoresistive effect element according to each embodiment will be described in detail with reference to the drawings. In the following description, elements having the same functions and configurations will be assigned the same reference numerals, and overlapping description will be made where necessary.

In general, according to one embodiment, a magnetoresistive effect element includes a recording layer including ferromagnetic material with perpendicular magnetic anisotropy to a film surface and a variable orientation of magnetization; a reference layer including ferromagnetic material with perpendicular magnetic anisotropy to a film surface and an invariable orientation of magnetization; a nonmagnetic layer between the recording layer and the reference layer; a first underlayer on a side of the recoding layer opposite to a side on which the nonmagnetic layer is provided; and a second underlayer between the recording layer and the first underlayer. The second underlayer is a Pd film including a concentration of $3 \times 10^{15}$ atms/cm$^2$.

EMBODIMENTS

(1) First Embodiment

A magnetoresistive effect element according to the first embodiment will be described with reference to FIGS. 1 to 10E.

(a) Basic Example

FIG. 1 is a sectional structure view illustrating a basic structure of a magnetoresistive effect element according to the present embodiment.

The magnetoresistive effect element according to the present embodiment has two magnetic layers 10 and 20, and a nonmagnetic layer 30 provided between the two magnetic layers 10 and 20.

The two magnetic layers 10 and 20 are perpendicular magnetization films (vertical magnetization film) in which magnetizations of the magnetic layers 10 and 20 are oriented in a direction perpendicular to the film surface.

The magnetic layers 10 and 20 include one film or a plurality of films.

The orientation (direction) of magnetization of one magnetic layer 10 of the two magnetic layers 10 and 20 is variable, and the orientation of magnetization of the other magnetic layer 20 is invariable. With the example illustrated in FIG. 1, the orientation of magnetization of the magnetic layer 10 is variable, and the orientation of magnetization of the magnetic layer 20 is invariable. With the present embodiment, the magnetic layer with the variable orientation of magnetization is referred to as "recording layer" (also referred to as "magnetization free layer", "free layer" or "memory layer"), and the magnetic layer with the invariable orientation of magnetization is referred to as "reference layer" (also referred to as "magnetization invariable layer" or "fixing layer").

The orientation of magnetization of the recording layer 10 is changed by spin transfer torque caused by a writing current (magnetization inversion current) Iw which flows to the magnetoresistive effect element 1. That is, the orientation of magnetization of the recording layer 10 is changed when a spin-polarized electron works on magnetization (spin) of the recording layer 10.

Meanwhile, when "the magnetization direction of the reference layer 20 is invariable", this means that the orientation of magnetization of the reference layer 20 does not change when a magnetization inversion current (inversion threshold) used to invert the magnetization direction of the recording layer 11 flows to the reference layer 20. Hence, by using a magnetic layer of a large inversion threshold as the reference layer 20 and using a magnetic layer of a smaller inversion threshold than the reference layer 20 as the recording layer 10 in the MTJ element 1, the MTJ element 1 is formed in which the recording layer 10 with the variable magnetization direction and reference layer 20 with the invariable magnetization direction are formed.

The recording layer 10 includes at least one of films 12B and 12C selected from a group including cobalt (Co) film, tantalum (Ta) film, niobium (Nb) film, molybdenum (Mo) film and tungsten (W) film. Hereinafter, tantalum (Ta) film, niobium (Nb) film, molybdenum (Mo) film and tungsten (W) film will be referred to as "insertion film (or metal film)".

A portion (layer or film) of the recording layer 10 provided adjacent to the nonmagnetic layer 30 is referred to as "interface layer".

When the recording layer 10 includes the Co film 12B on an underlayer, this Co film 12B has a surface space (distance between atomic layers) equal to or more than 1.35 Å and equal to or less than 1.55 Å in a sectional surface direction of the Co film 12B. The Co film 12B adopts an hcp (hexagonal closed packed lattice) or bcc (body centered cubic lattice) crystal structure. When the recording layer 10 adopts the hcp structure, the recording layer 10 is oriented toward an hcp (102) surface or a surface equivalent to the hcp (102) surface. When the recording layer 10 adopts the bcc structure, the recording layer 10 is oriented toward a bcc (001) surface and a surface equivalent to the bcc (001) surface. In addition, a Tb film may be used instead of a Co film. Further, the film 12B including both of Co and Tb may be formed in the recording layer 10. There are cases where a film including at least one of Co and Tb in the recording layer 10 is referred to as "magnetic layer (second magnetic layer)" or "insertion layer", similarly to the Ta film.

If the insertion film is selected from a Ta film, Nb film, Mo film or W film, the Ta film, Nb film, Mo film or W film 12C of the insertion film adopts the bcc structure. Further, the Ta film, Nb film, No film or W film is oriented toward the bcc (001) surface and a surface (bcc {001} surface) equivalent to the bcc (001) surface.

When the Ta film, Nb film, Mo film or W film is used for the insertion film 12C, for example, the recording layer 10 includes a magnetic layer including at least two types of elements of Co, Fe and B, and this magnetic film is provided on the Ta film (or W film, Nb film or Mo film) 12. The magnetic film (for example, CoFeB film or FeB film) on the Ta film (or Nb film, Mo film or W film) 12C is oriented toward the bcc (001) surface and a surface equivalent to the bcc (001) surface.

In addition, with the present embodiment, when a film or layer is oriented toward a crystal face, although only one orientation surface (crystal face) may be illustrated, it naturally follows that the film or layer is oriented toward the crystal face for which the film or layer is oriented toward a crystal face equivalent to this crystal face. Further, in addition to the crystal face, the same applies to the crystal orientation.

The underlayer 40 has an atom dense surface in an interface where the underlayer (first underlayer) 40 and recording layer 10 are adjacent. For example, a Pd film 11 is provided in the interface between the recording layer 10 and underlayer 40. The Pd film 11 substantially functions as an underlayer (second underlayer) with respect to a film on the Pd film 11. Further, the density of the Pd film 11 of the second underlayer is set to equal to or less than $3 \times 10^{15}$ atms/cm$^2$.

As described above, with the magnetoresistive effect element according to the present embodiment, the recording layer 10 including the insertion films 12B and 12C is provided on the underlayer 40 having the atom dense surface and Pd film 11. Further, the recording layer 10 including the insertion film 12B, 12C has magnetic anisotropy in a direction perpendicular to the film surface. Further, the insertion film 12B, 12C prevents impurities in the underlayer 40 from being diffused inside the nonmagnetic layer 30 or in the interface between the nonmagnetic layer 30 and recording layer 10.

By this means, the magnetoresistive effect element according to the present embodiment can improve element characteristics, for example, the MR ratio.

(b) Configuration Example

The magnetoresistive effect element according to a configuration example 1 of the present embodiment will be described using FIGS. 2 to 10E.

As illustrated in FIGS. 2 and 3, the magnetoresistive effect elements 1A and 1B according to the present configuration example 1 include a lower electrode 51, the underlayer 40, the recording layer 10, the nonmagnetic layer 30, the reference layer 20 and an upper electrode 52.

The magnetoresistive effect elements 1A and 1B according to the present configuration example 1 are MTJ (Magnetic Tunnel Junction) elements. Hereinafter, the magnetoresistive effect element will be referred to as "MTJ element".

The MTJ elements 1A and 1B according to the present configuration example 1 adopt a structure in which the reference layer 20 is layered on the recording layer 10 across the nonmagnetic layer 30, that is, adopts a so-called top pin structure.

With the MTJ elements 1A and 1B according to the present configuration example 1, the recording layer 10 and reference layer 20 adopt a multilayer structure. Hereinafter, a multilayer structure formed with a member A and a member B will be represented as "A/B". This means that the member (film) "A" on the left side of "/" is layered on the member (film) "B" on the right side of "/".

As illustrated in FIG. 2, the lower electrode 51 is provided on a substrate (not illustrated).

The lower electrode 51 adopts, for example, a multiplayer structure including a plurality of conductive films. The lower electrode 51 adopts, for example, a multilayer structure of Ta/Cu/Ta. The Ta film of a lowermost layer of the underlayer has, for example, a film thickness of 150 Å (15 nm). The Cu film on the Ta film has, for example, the film thickness of 350 Å (35 nm). The Ta film on a copper (Cu) film has, for example, the film thickness of 200 Å (20 nm).

The underlayer (first underlayer) 40 is provided on the lower electrode 51. The underlayer 40 adopts a multilayer structure of Ir/Ru. That is, an iridium (Ir) film 42 is layered on a ruthenium (Ru) film 41. The Ru film 41 has, for example, the film thickness of 50 Å (5 nm), and the Ir film 42 has, for example, the film thickness of 30 Å (3 nm).

The recording layer 10 is provided on the underlayer 40 including the atom dense surface.

The nonmagnetic layer 30 is provided on the recording layer 10. With the present embodiment, the nonmagnetic layer 30 is an MgO film. When an insulating material such as an MgO film is used for the nonmagnetic layer 30, the nonmagnetic layer 30 is referred to as "tunnel barrier layer". Hereinafter, the nonmagnetic layer 30 using the MgO film will be referred to as "tunnel barrier layer". The MgO film which is the tunnel barrier layer 30 has, for example, the film thickness of 10 Å (1 nm).

The reference layer 20 is provided on the tunnel barrier layer 30. The reference layer 20 adopts a multilayer structure. The reference layer 20 adopting the multilayer structure adopts a structure of a TbCoFe/CoFeB/Ta/CoFeB layer. In the reference layer 20 adopting the multilayer structure, a cobalt-iron-boron (CoFeB) film in the lowermost layer is in contact with the tunnel barrier layer (MgO film) 30. The CoFeB film in the lowermost layer has, for example, the film thickness of 15 Å (1.5 nm). The Ta film on the CoFeB film has, for example, the film thickness of 3 Å (0.3 nm). The CoFeB film on the Ta film is thinner than the CoFeB film in the lowermost layer, and has, for example, the film thickness of 4 Å (0.4 nm). A terbium-cobalt-iron (TbCoFe) film in the uppermost layer of the reference layer 20 has, for example, the film thickness of 120 Å (12 nm). The TbCoFe film is in contact with, for example, the upper electrode 52.

The upper electrode 52 is provided on the reference layer 20. The upper electrode 52 adopts a layered structure of Ru/Ta. The Ta film is in contact with the upper surface (here, the TbFeB film) of the reference layer 20. The Ru film is layered on the Ta film. The Ta film has, for example, the film thickness of 50 Å (5 nm). The Ru film has, for example, the film thickness of 200 Å (20 nm).

With the present configuration example, the recording layer 10 adopts a multilayer structure including a ferromagnetic material.

With the MTJ element 1A illustrated in FIG. 2, the recording layer 10 adopts a multiplayer structure including FeB/Ta/CoFeB/Co/Pd.

A palladium (Pd) film 11 in the lowermost layer of the recording layer 10 is in contact with the underlayer 40. The film thickness of the Pd film 11 is, for example, 2 Å (0.2 nm).

The Co film 12B is provided on the Pd film 11. The Co film 12B has, for example, the film thickness of about 5 Å (0.5 nm). The Co film 12B is a perpendicular magnetization film, and is used for the insertion film in the recording layer 10. The Tb film may be used instead of the Co film 12B. Further, a CoTb film may be used for the insertion film 12B.

The CoFeB film 13 is provided on the Co film 12B. The CoFeB film 13 has, for example, the film thickness of 4 Å (0.4 nm). The Ta film 12C is provided on the CoFeB film 13. The Ta film 12C has, for example, the film thickness of 3 Å (0.3 nm). The FeB film 15 is provided on the Ta film 12C. The FeB film 15 is a film in the uppermost layer of the recording layer 10, and the FeB film 15 is in contact with the tunnel barrier layer (MgO layer) 30. The FeB film 15 has, for example, the film thickness of 8 Å (0.8 nm).

Meanwhile, the FeB/Ta/CoFeB layer is also used for an interface layer between the recording layer (Co film) 10 and tunnel barrier layer (MgO film) 30.

As long as the FeB film 15 and CoFeB film 13 of the interface layer are alloy films containing at least two elements of Co, Fe and B, the composition ratio of Co, Fe and B in the film can be adequately changed. For example, a CoFeB film may be used instead of the FeB film 15. Similarly to the CoFeB film 13, the film (alloy film) including Co, Fe and B has perpendicular magnetic anisotropy.

For the film (first magnetic layer) 15 of the recording layer 10 which is adjacent to the nonmagnetic layer, the CoFeB film may be used instead of the FeB film. In this case, the composition of the interface layer is preferably designed such that the composition of Fe contained in this CoFeB film 15 on the nonmagnetic layer 30 side is greater than the composition of Fe contained in the CoFeB film (second magnetic layer) 13 on the underlayer 40 side. Further, in this case, the composition of the interface layer is preferably designed such that the composition of Co of the CoFeB film 15 on the nonmagnetic layer 30 side is less than the composition of Co of the CoFeB film 13 on the underlayer 40 side.

For example, when the composition of the magnetic film (second interface magnetic film) 15 in the interface layer on the nonmagnetic layer 30 side is represented by $(Co_x Fe_{100-x})_{100-z}B_z$, the relationship of $x \leq 75$ atomic % and $0 \leq z \leq 30$ atomic % preferably holds. By contrast with this, when, for example, the composition of the magnetic layer (first interface magnetic film) 13 in the interface layer on the underlayer 40 side (Pd film 11 side) is represented by $(Co_w Fe_{100-w})_{100-z}B_z$, the relationship of $0 \leq z \leq 30$ atomic % and $x<w$ preferably holds. The two magnetic layers 13 and 15 sandwich the insertion film 12C such as a Ta film.

The CoFeB film 15 on the nonmagnetic layer side is mainly used as a function layer for improving the MR ratio of the MTJ element, and therefore a material of good lattice match to the MgO film of a tunnel barrier layer is preferably used. bcc-Fe has better lattice match to MgO than hcp-Co, and therefore the composition of Fe is preferably increased more than the composition of Co in the CoFeB film 15.

Further, the CoFeB film 13 on the underlayer side is mainly used as a function layer for improving perpendicular magnetic anisotropy of the recording layer. Co has greater crystal magnetic anisotropy than Fe, and therefore it is preferable to make the composition of Co greater than the composition of Fe in the CoFeB film 13.

Instead of using the FeB/Ta/CoFeB structure in the interface layer, one of an FeB/Ta/CoB structure, CoFeB/Ta/CoB structure and CoFeB/Ta/CoFeB structure may be used in the interface layer. In addition, in the interface layer adopting the CoFeB/Ta/CoFeB structure, the composition (concentration) of Fe in the CoFeB film 15 on the tunnel barrier layer side is preferably greater than the composition (concentration) of Fe in the CoFeB film 13 on the underlayer side.

Further, the Ta film (metal film) 12C is an interface layer and is used as an insertion film of the recording layer 10. In addition, as long as the insert film, for example W film, Nb film or Mo film, is a high melting point metal, the W film, Nb film or Mo film may be used as an insertion film (metal film) instead of the Ta film 12C.

With the MTJ element 1A in FIG. 2, the Pd film 11 in the recording layer 10 also functions as an underlayer (second underlayer). Hence, there are cases where the Pd film 11 is included in the underlayer 40. The crystal structure of the Pd film 11 is an fcc (face center cubic lattice) structure, and has a dense surface oriented toward a (111) surface.

FIG. 3 illustrates a modified example of the MTJ element in FIG. 2.

The recording layer 10 illustrated in FIG. 3 adopts a multilayer structure formed with a FeB/Ta/CoFeB/Co/Pd/Co layer.

In the recording layer 10 of the MTJ element in FIG. 3, the Co film 12A in the lowermost layer of the recording layer 10 is in contact with the underlayer 40. The Pd film 11 is sandwiched by the two Co films 12A and 12B in a direction in which films are layered. Hereinafter, the Co film 12A between the Pd film 11 and underlayer 40 will be referred to as "lower Co film 12A". The Co film 12B on the Pd film 11 is referred to as "upper Co film 12B".

Regarding the film thicknesses of the Co films 12A and 12B sandwiching the Pd film 11, the film thickness of the lower Co film 12A is represented by (5-tx) Å, and the film thickness of the upper Co film 12B is represented by tx Å. According to the relationship between the film thicknesses of these Co films 12A and 12B, when the film thickness of the upper Co film 12B becomes thicker, the film thickness of the lower Co film 12B becomes thinner. For example, when the film thickness of the upper Co film 12B is 3 Å, the film thickness of the lower Co film 12A is 2 Å.

In the recording layer 10 of the MTJ elements 1A and 1B according to the present configuration example, a value of "tx" representing the film thickness of the upper Co film 12B is greater than 0 and is equal to or less than 5. In case of tx=5, the film thickness of the lower Co film 12A is 0 Å, and the film thickness of the upper Co film 12B is 5 Å. The case of tx=5 corresponds to the structure of the MTJ element 1A illustrated in FIG. 2.

In addition, although components adopting a multilayer structure in the MTJ elements 1A and 1B adopt the above multilayer structure upon deposition of films, it naturally follows that applying heat after films are deposited forms compounds in interfaces of adjacent films or causes alloying.

As described above, the recording layer 10 and reference layer 20 are perpendicular magnetization films in which orientations (directions) of magnetizations are perpendicular with respect to the film surface (layering direction).

With the MTJ element according to the present embodiment, the relative orientations of magnetizations of the recording layer 10 and reference layer 20 are inversed according to, for example, a spin-transfer-torque magnetization inversion scheme.

When the orientation of magnetization of the recording layer 10 and the orientation of magnetization of the reference layer 20 are parallel, that is, when the orientation of magnetization of the recording layer 10 and the orientation of magnetization of the reference layer 20 are the same, a current Iw (see FIG. 1) flowing from the recording layer 10 to the reference layer 20 is supplied to the MTJ elements 1A and 1B. In this case, electrons move from the reference layer 20 to the recording layer 10 through the tunnel barrier layer 30. Majority electrons (spin-polarized electrons) of electrons having passed the reference layer 20 and tunnel barrier layer 30 have the same orientation of spin as the orientation of magnetization (spin) of the reference layer 20. A spin angular movement amount (spin torque) of these spin-polarized electrons is applied to the magnetization of the recording layer 10 to invert the orientation of magnetization of the recording layer 10. The orientation of magnetization of the recording layer 10 is same (parallel-alignment) as the orientation of magnetization (spin) of the reference layer 20. In this parallel alignment (parallel state), the resistance value of the MTJ element 1A and 1B becomes minimum.

When the orientation of magnetization of the recording layer 10 and the orientation of magnetization of the reference layer 20 are non-parallel, that is, when the orientation of magnetization of the recording layer 10 is opposite to the orientation of magnetization of the reference layer 20, a current flowing from the reference layer 20 to the recording layer 10 is supplied to the MTJ element 1A and 1B. In this case, electrons move from the recording layer 10 to the reference layer 20. Electrons having the spin which is not parallel to the orientations of magnetizations of the reference layers 20 are reflected by the reference layer 20. The reflected electrons are transferred to the recording layer 10 as the spin-polarized electrons. The spin angular movement amount of these spin-polarized electrons (reflected electrons) is applied to the magnetization of the recording layer 10, and the orientation of magnetization of the recording layer 10 is opposite (non-parallel alignment) to the orientation of magnetization of the reference layer 20. In this non-parallel alignment (non-parallel state), the resistance value of the MTJ element 1 becomes maximum.

FIG. 4 illustrates the MR ratio (Magnetic Resistance Ratio) of an MTJ element illustrated in FIG. 2 and FIG. 3.

The vertical axis in FIG. 4 indicates the MR ratio (unit:[%]) of the MTJ element. The MR ratio is represented by "$(R_{AP}-R_P)/R_P$". "$R_P$" represents a resistance value when the orientations of magnetizations of the recording layer 10 and reference layer 20 are parallel, and "$R_{AP}$" represents a resistance value when the orientations of magnetizations of the recording layer 10 and reference layer 20 are not parallel.

The horizontal axis in FIG. 4 represents a value of "tx" (unit: film thickness [Å]) in film thicknesses (5-tx) and tx of the upper/lower Co films 12A and 12B included in the recording layer 10.

The MR ratio of the MTJ element 1 illustrated in FIG. 2 corresponds to the case of tx=5. Meanwhile, the MR ratio of the MTJ element 1 is also illustrated in a case where the film thickness tx of the upper Co film 12B of the MTJ element 1A and 1B illustrated in FIG. 2 and FIG. 3 is 0 Å, that is, in a case where the Co film is not provided between the MgO film 30 and Pd film 11. When the film thickness tx is 0 Å, the Pd film 11 is in contact with the interface layer (here, CoFeB film 13).

With each MTJ element for which the MR ratio is measured, heating processing is executed after the MTJ element is formed. The heating processing is executed with respect to the MTJ element in a vacuum at the temperature of 325° C. for 30 minutes. In addition, there are cases where this heating processing alloys the Pd film and Co film. This heating processing is executed to improve the MR ratio of the MTJ element.

As illustrated in FIG. 4, in a case of film thickness tx=0 Å, that is, when the Co film is not provided between the MgO film 30 and Pd film 11, the MR ratio of the MTJ element is about 90%. The resistance value (area resistance) RA of this MTJ element is about 23Ωμm².

For a film thickness tx=5 Å, that is, in a case of the MTJ element (element in FIG. 2) in which the Co film is not provided between the Pd film 11 and underlayer 40, the MR ratio of this MTJ element 1A is about 162%. The area resistance RA of this MTJ element 1A is about 25Ωμm².

For tx=1 Å to 4 Å (0.1 nm to 0.4 nm), that is, in a case of the MTJ element illustrated in FIG. 3, the MR ratio changes within the range of 100% to 150%.

As illustrated in FIG. 4, when the film thickness of the upper Co film 12B provided between the tunnel barrier layer 30 and Pd film 11 becomes thicker and the film thickness of the lower Co film 12A provided between the underlayer 40 and Pd film 11 becomes thinner (becomes 0 Å), the MR ratios of the MTJ elements 1A and 1B improve.

FIG. 5 illustrates an observational result of the MTJ element using a transmission electron microscope. FIG. 5 illustrates transmission electron microscopic images of the MTJ element 1A in FIG. 2 and the MTJ element in which the film thickness tx of the upper Co film is 0 Å.

FIGS. 5(a) and 5(b) each illustrate a TEM (Transmission Electron Microscope) observational image of each MTJ element. FIGS. 5(a) and 5(b) illustrate observational results of TEM images in a dark field of view. FIG. 5(c) illustrates a multiple wave interference image of the sectional surface of each MTJ element.

The TEM image in FIG. 5(a) shows an observational image of the sectional surface of the MTJ element in a case where the objective aperture of the TEM is set at a diffraction spot corresponding to a surface space (distance between atomic layers) d=2.0 Å to 2.2 Å (0.20 to 0.22 nm) of crystal in the direction perpendicular to the film surface. This surface space (2.0 to 2.2 Å) corresponds to the surface space of an MgO (002) surface, Ru (002) surface or CoFe (011) surface.

The TEM image in FIG. 5(b) shows an observational image of the sectional surface of the MTJ element in a case where the objective aperture of the TEM is set at a diffraction spot corresponding to the surface space (distance between atomic layers) d=1.35 Å to 1.55 Å (0.135 to 0.155 nm) of crystal in the direction perpendicular to the film surface. This surface space (1.35 to 1.55 Å) corresponds to the surface space of a CoFe (002) surface.

In the upper part of FIG. 5(a), the MTJ element 1A (structure in FIG. 2) is illustrated as having the upper Co film (tx=5 Å), and, in the lower part of FIG. 5(a), the MTJ element 1A without the upper Co film (tx=0 Å) is illustrated. Similarly to FIG. 5(a), in the upper part of FIGS. 5(b) and 5(c), the MTJ element 1A (structure in FIG. 2) is illustrated as having the upper Co film (tx=5 Å), and, in the lower part of FIGS. 5(b) and 5(c), the MTJ element 1A without the upper Co film (tx=0 Å) is illustrated.

As illustrated in FIG. 5(a), under the measurement condition in FIG. 5(a), MTJ element including the FeB/Ta/CoFeB/Co/Pd layer of the recording layer 10 according to the present embodiment has more white portions, at parts corresponding to the MgO film than the FeB/Ta/CoFeB/Pd/Co layer. This means that the MgO film, which is the tunnel barrier layer of the MTJ element 1A according to the present embodiment, has a large amount of crystals in the MgO (002) surface and a surface ({002} surface) equivalent to the MgO (002) surface in a film sectional surface direction (in-film surface direction).

When the crystal amount of the MgO film is large, that is, when the crystallinity of the MgO film is improved, it is possible to improve the spin filter effect of the MgO film of the tunnel barrier layer. As a result, the MTJ element 1A according to the present embodiment can have a high MR ratio.

Based on the observational image illustrated in FIG. 5B, the setting condition of each diffraction spot (surface space) and the film thickness of the Co film (layered structure of the Pd film and Co film) are respectively compared.

At a diffraction spot corresponding to a surface space d=1.35 Å to 1.55 Å in a direction perpendicular to the film surface, under the observational condition in which the objective aperture of the TEM is set, the FeB/Ta/CoFeB/Co/Pd layer which is the recording layer 10 according to the present embodiment has more white portions than an observational image at another diffraction spot or FeB/Ta/CoFeB/Pd/Co layer. This shows that, with the recording layer 10 of the MTJ element 1A according to the present embodiment, the crystal amount of the CoFe (002) surface and a surface ({002} surface) equivalent to the CoFe (002) surface in the film sectional surface direction (in-film surface direction) or an hcp (102) surface of a hcp-Co film and a surface equivalent to the hcp (102) surface is greater.

Co (Co film) generally adopts an hcp (hexagonal closed packed) structure, and the dense surface has a stable structure.

FIG. 6 illustrates the relationship between a Co surface space and crystal structure.

As illustrated in FIG. 6, when the surface space d of Co is 1.35 Å to 1.55 Å, the hcp-Co film adopts a crystal structure of the hcp (102) surface.

Due to the influence of the underlayer, the Co film on the underlayer 40 changes (phase transition) from the hcp structure to the bcc structure. When the surface space d of the bcc-Co film is 1.35 Å to 1.55 Å, the bcc-Co film adopts a crystal structure of the bcc (001) surface.

Thus, the observational result of the TEM illustrated in FIG. 5 shows that, when the Co film is formed on the Ir film having the dense surface or Pd/Ir layered structure, a surface space d of the Co film with respect to the sectional surface (in-film surface perpendicular direction) of the film adopts a crystal structure corresponding to about 1.35 Å to 1.55 Å.

That is, the observational result of the TEM illustrated in FIG. 5 shows that, when the Co film is formed on the Ir film having the dense film or Pd/Ir film, the Co film does not adopt an hcp (001) structure (is not preferentially oriented toward the hcp (001) surface).

With the present embodiment, when the Co film 12B is formed on the underlayer (here, the Ir film or Pd/Ir layered structure) having the dense surface, the Co film 12B is oriented toward the hcp (102) surface or bcc (001) surface. In addition, it naturally follows that the Co film 12B is also crystalline-oriented toward a surface equivalent to the hcp (102) surface, or a surface equivalent to the bcc (001) surface.

In addition, with the FeB/Ta/CoFeB/Pd/Co layer, the Co film is provided on the Ir film. However, Pd between the Co film and FeB/Ta/CoFeB film is diffused, thereby blocking crystallization of the FeB/Ta/CoFeB film. Hence, the FeB/Ta/

CoFeB/Pd/Co layer has a lower crystal amount crystalline-oriented toward the hcp (102) surface or bcc (001) surface than the FeB/Ta/CoFeB/Co/Pd layer which is the recording layer according to the present embodiment.

FIG. 7A and FIG. 7B illustrate the crystal structure of hcp-Co (102). FIG. 7A illustrates the crystal structure when the hcp-Co (102) surface is seen from the direction perpendicular (above) to the film surface, and FIG. 7B illustrates the crystal structure when the hcp-Co (102) surface is seen from the sectional direction of the film.

The crystal structure of the hcp-Co (102) surface adopts a rectangular structure with respect to an in-film surface direction (film horizontal direction). One surface space (lattice constant of a short side) d1 of the rectangular crystal surface is 2.5 Å, and the other surface space (lattice constant of a long side) d2 is 6.5 Å.

The surface space d1 of 2.5 Å lattice-matches the lattice constant 2.8 Å in the in-film direction of the bcc-CoFe (100) surface.

The surface space d2 of 6.5 Å lattice-matches the lattice constant 4.2 Å in the in-film surface direction of the MgO (100) surface. Meanwhile, in this case, the surface space d2 of the hcp-Co (102) surface and a lattice constant of the MgO (100) surface do not lattice-match one to one, and the hcp-Co (102) surface and MgO (100) surface lattice-match at a value which approximates to a common multiple of the surface space d2 of hcp-Co (102) and the lattice constant of the MgO (100) surface. For example, three lattice constants (4.2×3=12.6 Å) of the MgO (100) surface substantially lattice-match two surface spaces d2 (6.5×2=13 Å) in the hcp-Co (102) surface.

In addition, the MgO (100) surface is substantially equivalent to the MgO (001) surface or MgO (002) surface. Also, with a bcc-CoFe, the bcc-CoFe (100) surface is substantially equivalent to the bcc-CoFe (001) surface.

When the Co film 12B adopts a structure of bcc-Co (001), that is, when the Co film 12B is oriented toward the bcc-Co (100), the bcc-Co (001) surface lattice-matches the CoFe (110) surface or MgO (100) surface.

Thus, when the Co film 12B is formed on the Ir film 40 having the dense surface or Pd/Ir films 11 and 40, the Co film 12B on the atom dense surface adopts a crystal structure of hcp-Co (102) or bcc-Co (001), and is preferentially oriented toward the hcp-Co (102) surface or bcc-Co (001) surface. By this means, lattice-mismatch between the Co film 12B and MgO/CoFeB layers 30 and 15 on the Co film 12B is alleviated.

That is, when the Co film 12B is oriented toward the hop-Co (102) surface or bcc-Co (001) surface, crystallization of the CoFeB(110) film and MgO (100) film is promoted. Consequently, the spin filter effect of the MgO film of the tunnel barrier layer 30 improves. Further, the polarizability of the interface between the CoFeB film 15 and MgO film 30 increases.

As a result, as illustrated in FIG. 4, when the film thickness of the Co film 12A between the Pd film 11 and underlayer 40 becomes thinner, the MR ratio of the MTJ element improves.

Figure 8:
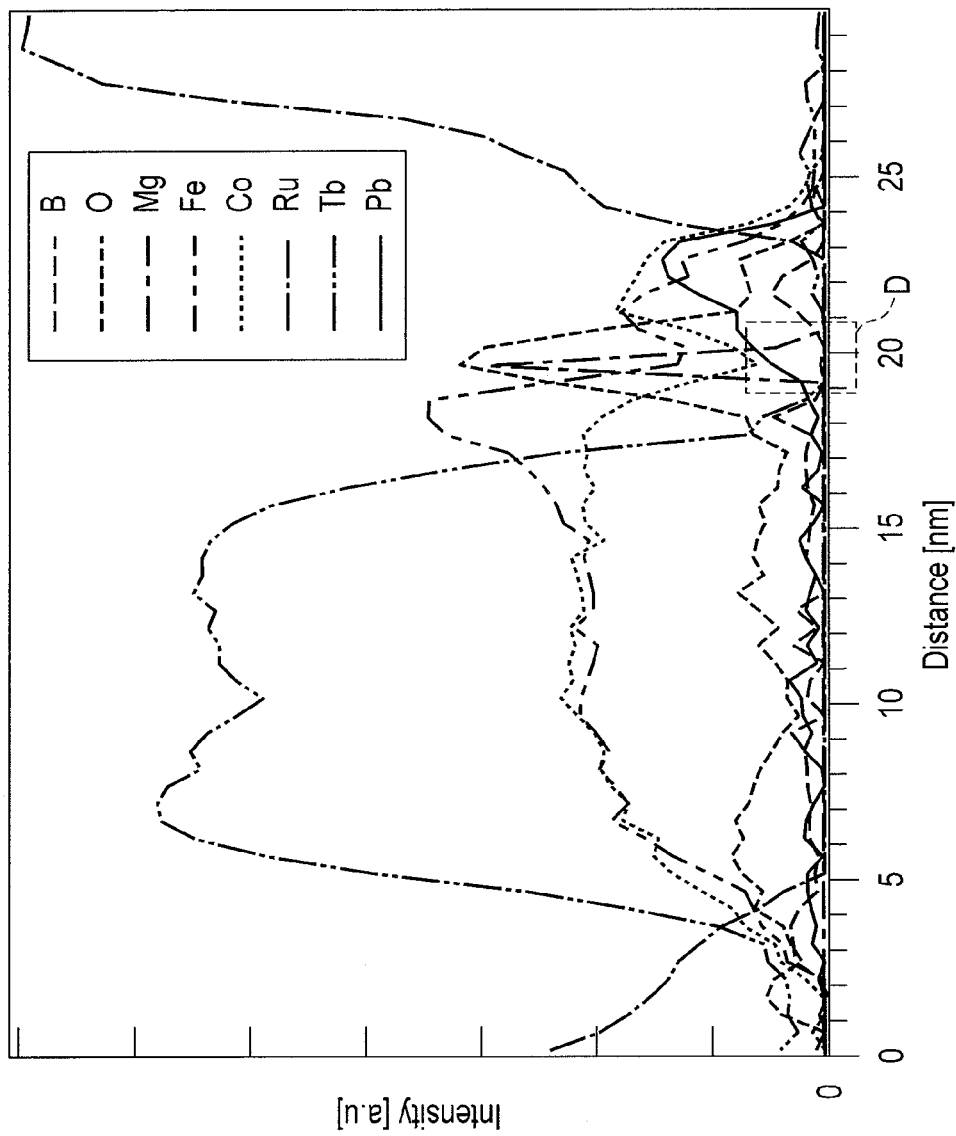
FIG. 8 is a view illustrating a measurement result of EELS of a magnetoresistive effect element.

FIG. 8 illustrates a measurement result of electron energy-loss spectroscopy (EELS) with respect to the MTJ element in a case where the Co film 12B is not provided between the MgO/FeB film and Pd film (tx=0 Å). In FIG. 8, the horizontal axis of the graph corresponds to the depth (unit: nm) from the upper surface of the element in the film layering direction, and the vertical axis of each graph corresponds to a detected signal intensity (arbitrary unit).

An area indicated as an area D in FIG. 8 corresponds to the part of the MgO film of the MTJ element. As illustrated in FIG. 8, when the Co film (insertion film) is not provided between the MgO film and Pd film, diffusion of Pd near the MgO film or inside the MgO film is measured in the area D.

When Pd is diffused in the interface between the MgO film 30 and FeB film 15, in the MgO film 30 or in the FeB film 15, the polarizabilities of the MgO film 30 and FeB film 15 decrease and the MR ratio of the MTJ element decreases.

When the measurement result of the MR ratio in FIG. 2 shows that the value of the film thickness tx of the upper Co film is 0 Å, that is, when the Co film 12B does not exist between the MgO film 30 and Pd film 11, diffusion of Pd is one reason why the MR ratio of the MTJ element is small.

By contrast with this, when the value "tx" is greater than 0, the Co film 12B is provided on the Pd film 11, and the Co film 12B is provided between the Pd film 11 and MgO film/FeB film 30 and 15. Consequently, the Pd film 11 and MgO film/FeB film 30 and 15 are spaced apart, and diffusion of Pd to the MgO film/FeB film 30 and 15 is prevented. Instead of this, Co in the Co film 12B couples to diffused Pd, thereby forming a CoPd alloy. This alloying reduces the amount of Pd to be diffused.

As in the MTJ element 1A according to the present configuration example 1, the Co film 12B is provided between the Pd film 11 and MgO/FeB films 30 and 15, so that diffusion of Pd to the MgO/FeB films 30 and 15 is prevented.

As described above, the Co film is provided between the Pd film and interface layer (or MgO film), so that the MR ratio of the MTJ element improves.

Consequently, with the MTJ element 1A according to the present embodiment, it is possible to improve characteristics of the MTJ element.

Hereinafter, the dependency of the film thickness of the Pd film on the MTJ element will be described using FIG. 9.

Figure 9:
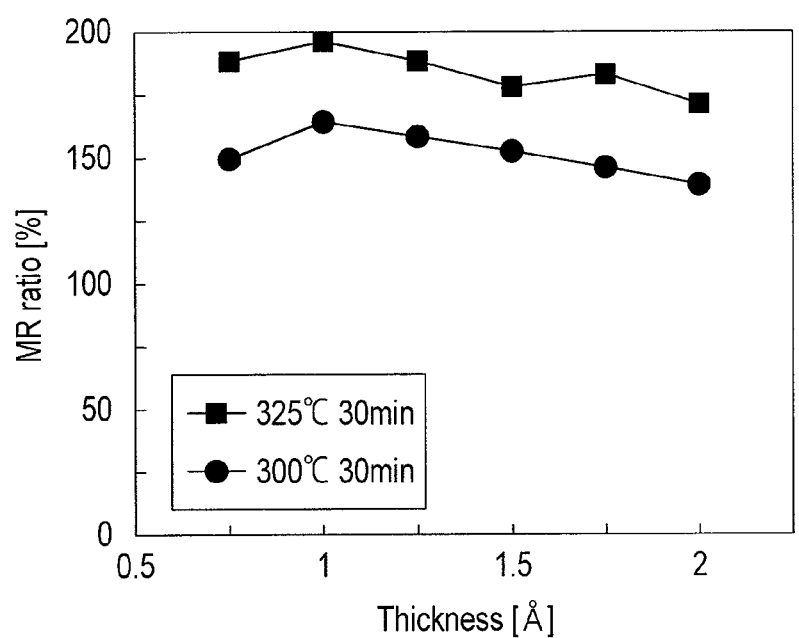
FIG. 9 is a view illustrating the relationship between an MR ratio of a magnetoresistive effect element and a film thickness of a Pd film.

FIG. 9 illustrates a graph illustrating the relationship between the film thickness of the Pd film in the MTJ element and the MR ratio of the element. The horizontal axis of FIG. 9 represents the film thickness (unit: Å) of the Pd film, and the vertical axis of FIG. 9 represents the MR ratio (unit:%) of the MTJ element.

The structure of the MTJ element used for measurement is substantially the same as the structure of the MTJ element 1A in FIG. 2. Meanwhile, in the measured MTJ element 1A, the film thickness of the Pd film 11 changes from about 0.75 Å to 2 Å. Further, the Co film having the film thickness of 5 Å is provided on the Pd film 11. The CoB film is provided on the Co film. The film thickness of the CoB film is about 4 Å. In the CoB film, the composition of Co is set to "80", and the composition of B is set to "20". Meanwhile, the CoB film having this composition is represented as a $Co_{80}B_{20}$ film. The Ta film is provided on the $Co_{80}B_{20}$ film. The film thickness of the Ta film is about 3 Å. The CoFeB film is provided on the Ta film. The film thickness of the CoFeB film is about 9 Å. In the CoFeB film, the composition of CoFe is set to "80", and the composition of B is set to "20". Further, in the CoFeB film, with the composition ratio of Co and Fe, while the composition of Co is set to "1", the composition of Fe is set to "9". Hereinafter, the CoFeB film having this composition is represented as a $(Co_1Fe_9)_{80}B_{20}$ film.

FIG. 9 illustrates a case where, after the above MTJ element is formed, heating processing is applied to the element at 325° C. for 30 minutes, and a case where heating processing is applied to the element at 300° C. for 30 minutes.

As illustrated in FIG. 9, when the thickness of the Pd film 11 is about 1.0 Å, the MR ratio of about 160% to 200% is obtained. When the thickness of Pd film 11 is greater than 1.0 Å, the MR ratio starts decreasing. This is because the diffusion amount of Pd increases.

The thickness of the Pd film 11 between the Co film 12A and underlayer 40 is preferably one atom layer or less, and the density (concentration) of the Pd film 11 is preferably $3 \times 10^{15}$ atms/cm² or less. The quantity of $3 \times 10^{15}$ atms/cm² means that there are $3 \times 10^{15}$ atoms per 1 cm². When the thickness of the Pd film 11 is about 1 Å, the density of the Pd film is, for example, about $1.3 \times 10^{15}$ atms/cm². With the present embodiment, the density of the Pd film is a value calculated from conversion values of the property value of Pd (such as atomic weight), film thickness of the Pd film and dimension of the MTJ element. Meanwhile, it is also possible to calculate the density of the Pd film according to mass spectrometry such as ICP (Inductively Coupled Plasma) mass spectrometry.

When the thickness of the Pd film 11 is about 1 Å (the density of the Pd film 11 is about $1.3 \times 10^{15}$ atms/cm²), even if heat at about 300° C. to 325° C. is given to the MTJ element, the insertion film in the recording layer 10 (for example, the Co film or Ta film) prevents a Pd atom included in the Pd film from being diffused to the vicinity of the interface of the tunnel barrier layer/recording layer.

Consequently, with the MTJ element according to the present embodiment, by adjusting the film thickness of the Pd film which is the recording layer or underlayer, it is possible to obtain a high MR ratio as illustrated in FIG. 9.

As described above, with the MTJ element 1A according to the present embodiment, it is possible to improve characteristics of the MTJ element.

(c) Material Example

An example of a material used for the magnetoresistive effect element according to the present embodiment will be described using FIG. 10A to FIG. 10E.

(c-1) Recording Layer

Meanwhile, although FIG. 10A to FIG. 10E illustrate an example of a structure and an example of a material of the recording layer 10 of perpendicular magnetization in the magnetoresistive effect element (MTJ element), the structure and material are not limited to these.

Examples of a structure and examples of a material of the recording layer of perpendicular magnetization include the following i) to viii). Meanwhile, the structures of i) to viii) adopt a layered structure, and, similar to the layered structures in FIG. 2 and FIG. 3, "member A/member B" means that the member "A" on the left side of "/" is provided on a member "B" on the right side of "/".

i) CoFeB/Ta/CoFeB/Co/Pd
ii) CoFeB/Ta/CoFeB/Co
iii) CoFeB/Ta/CoB/Pd
iv) CoFeB/Ta/CoB
v) CoFeB/Ta/Co/Pd
vi) CoFeB/Ta/Co
vii) CoFeB/Ta/Pd
Viii) CoFeB/Co/Pd In addition, instead of the Ta film in the structures of i) to vii), a W film, Nb film or Mo film may be used as part of the recording layer (insertion film).

When the magnetic layer in the layered structures i) to vii) is applied to the recording layer of the MTJ element, CoFeB on the leftmost side is in contact with the MgO film of the tunnel barrier layer.

In the CoFeB film which is in contact with the MgO film, the composition of Fe in the CoFeB film is preferably greater than the composition of Co. By contrast with this, when the CoFeB film is provided immediately below the Ta film (on the underlayer side), the composition of Fe in the CoFeB film below the Ta film is preferably less than the composition of Co.

By making the composition of Fe higher than the composition of Co in the CoFeB film which is in contact with the MgO film, crystallization of the CoFeB film to be oriented toward the bcc (100) surface is promoted.

The composition (concentration) of Co is made higher than the composition (concentration) of Fe in the CoFeB film below the Ta film (on the underlayer side) to improve heat resistance of perpendicular magnetic anisotropy against heating due to crystallization of each film in the MTJ element.

Consequently, it is possible to improve the MR ratio of the MTJ element.

When the CoFeB film is provided immediately below the Ta film (on the underlayer side), it is possible to obtain the same effect as above by making the composition of Fe included in the CoFeB film which is in contact with the MgO film higher than the composition of Fe included in the CoFeB film provided immediately below the Ta film (on the underlayer side). Further, by making the composition of Co included in the CoFeB film which is in contact with the tunnel barrier layer (MgO film) lower than the composition of Co included in the CoFeB film immediately below the Ta film (on the underlayer side), it is possible to improve the MR ratio of the MTJ element.

In addition, although the CoFeB film and CoB film are illustrated as components of the recording layer, the components are not limited to these as long as an alloy film including at least two of Co, Fe and B is used. For example, it naturally follows that the CoFe film or FeB film may be used instead of the CoFeB film and CoB film.

Further, the Ta film, W film, Nb film or Mo film provided below the CoFeB film prevents Pd of the lower layer from being diffused toward the tunnel barrier layer side substantially similarly to the Co film. Further, the Ta film, W film, Nb film or No film is oriented toward the bcc (001) surface and a surface (bcc {001} surface) equivalent to the bcc (001) surface. For example, a film on the Ta film, W film, Nb film or No film (for example, CoFeB film) lattice-matches to the Ta film, W film, Nb film or No film oriented toward the bcc (001) surface and is crystalline-oriented. By this means, the Ta film, W film, Nb film or Mo film promotes crystallization of the CoFeB film of the upper layer to be oriented toward the bcc (100) surface. Further, the Ta film, W film, Nb film or No film provides an effect of providing perpendicular magnetic anisotropy to the CoFeB film of the upper layer. In addition, in the recording layer (interface layer), a film which lattice-matches to and is crystalline-oriented toward the Ta film, W film, Nb film or Mo film is also referred to as an "oriented film".

Thus, similarly to the structure in which the Co film is provided below the CoFeB film, the Ta film, W film, Nb film or Mo film is provided below a film (here, CoFeB film) which is in contact with the tunnel barrier layer, so that it is possible to improve the MR ratio of the MTJ element.

Hereinafter, a more detailed structure of the recording layer will be illustrated, and the structures of i) to viii) having perpendicular magnetic anisotropy will be illustrated.

FIGS. 10A to 10E illustrate magnetic characteristics (M-H characteristics) of the magnetic layer of the recording layer.

Figure 10A:
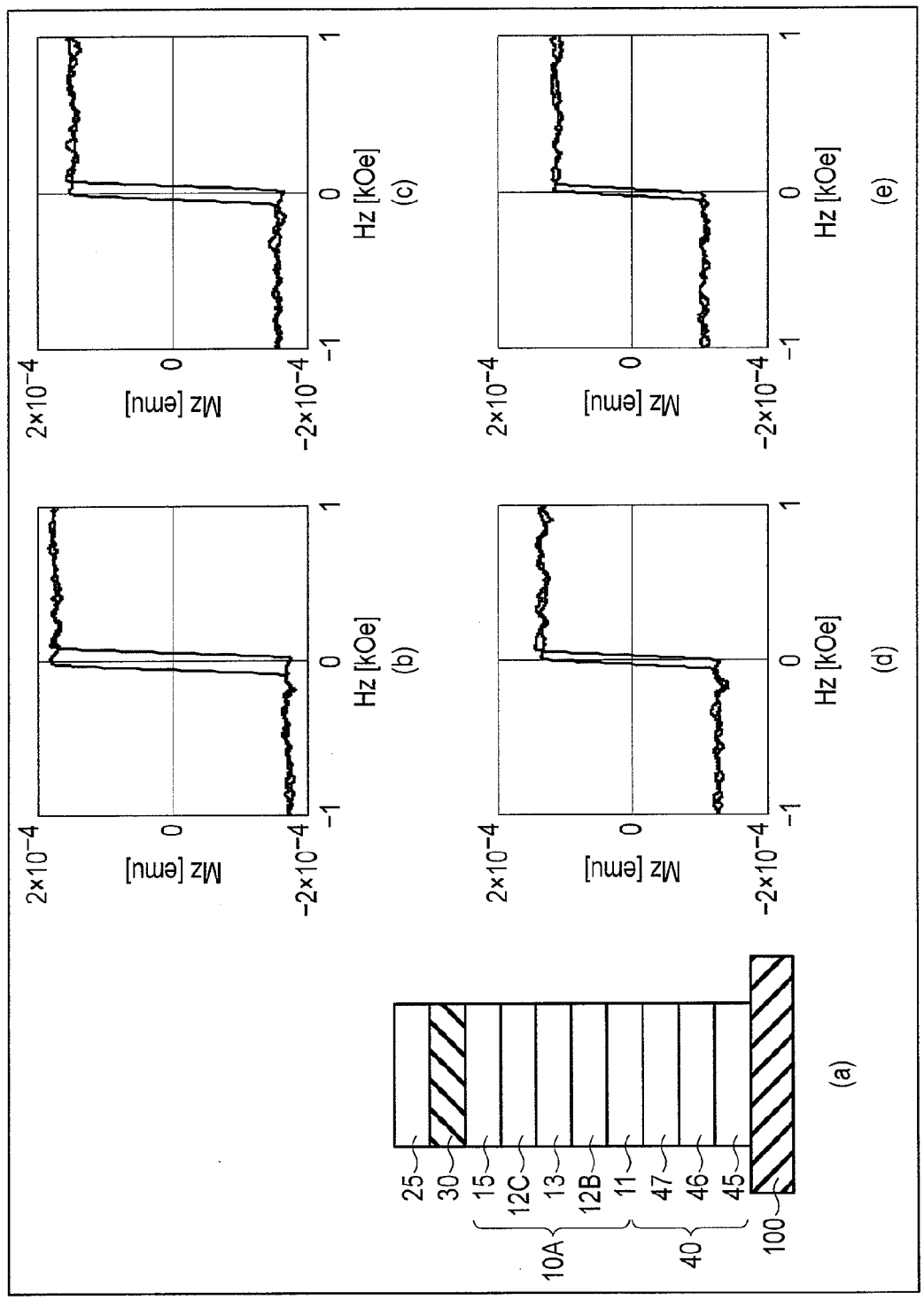
FIG. 10A is a view illustrating magnetic characteristics of a magnetic layer.

FIG. 10A(a) illustrates a structure of a magnetic layer (recording layer) for which magnetic characteristics are measured.

In FIG. 10A(a), the recording layer 10A has a CoFeB/Ta/CoB/Co layer (or CoFeB/Ta/CoB/Co/Pd layer).

Magnetic characteristics of the recording layer illustrated in FIG. 10A (b), (c), (d) and (e) are characteristics when the film thicknesses of the Co film in the lowermost layer and CoB film on the Co film are respectively changed.

In the recording layer 10A in FIG. 10A, the film thickness of the Co film 12B in the lowermost layer is about 2.5 Å (0.25 nm) or 5 Å (0.5 nm).

The CoB film (second magnetic layer) 13 is layered on the Co film 12B. In FIG. 10A, the film thickness of the CoB film 13 is about 2 Å (0.2 nm) or 4 Å (0.4 nm).

The Ta film 12C is layered on the CoB film 13. The Ta film 12C has the film thickness of 3 Å (0.3 nm).

The CoFeB film (first magnetic layer) 15 on the Ta film 12C has the film thickness of 8.5 Å (0.85 nm). Meanwhile, with the composition ratio of Co and Fe in the CoFeB film 15, while the composition of Co the composition of Fe "9".

The Co film 12B in the lowermost layer is provided on the Pd film 11. The Pd film 11 on the underlayer 40 also functions as an underlayer as described above. Therefore, the Pd film 11 may be used as the recording layer 10A or as the underlayer 40. The structure of FIG. 10A(a) corresponds to the structure of when the Pd film 11 is the recording layer, and the corresponds to the structure of ii) when the Pd film 11 is the underlayer.

Meanwhile, the film thickness of the Pd film 11 is about 2 Å (0.2 nm).

The underlayer 40 is provided on the substrate 100. As described above, the underlayer 40 has the atom dense surface in the surface on which the recording layer 10A is layered. The underlayer 40 adopts a layered structure of Ir/Ru/Ta. The Ta film 45 on the substrate 100 has the film thickness of 50 Å (5 nm). The Ru film 46 is layered on the Ta film 45. The film thickness of the Ru film 46 is about 50 Å (5 nm). The Ir film 47 in the uppermost layer is layered on the Ru film 46. The film thickness of the Ir film 47 is about 30 Å (3 nm).

The MgO film 30 is provided on the CoFeB film 15 in the uppermost layer of the recording layer 10A. The Ta film 25 having about 50 Å (5 nm) is layered on the MgO film 30.

The layered structure of the recording layer in FIG. 10A is substantially the same as the layered structure of the recording layer of the MTJ element 1A illustrated in FIG. 2.

Heating processing is executed with respect to a layered body including the recording layer in FIG. 10A (a) at 325° C. for 30 minutes. Magnetic characteristics of the recording layer after heating processing are illustrated in FIG. 10A (b), (c), (d) and (e). In FIG. 10A (b), (c), (d) and (e), the horizontal axis of the graph indicates a magnetic field Hz (unit: kOe) applied in the direction perpendicular to the film surface, and the vertical axis of the graph indicates a perpendicular component Mz (unit: emu) of magnetization of the recording layer 10A. In addition, also in FIG. 10B to FIG. 10E described later, the relationship between the vertical axis and horizontal axis of the graph illustrating the magnetic characteristics is the same as in FIG. 10A.

FIG. 10A(b) illustrates a case where the film thickness of the Co film 12B in the recording layer 10A is 5 Å (0.5 nm), and the film thickness of the CoB film 13 is 4 Å (0.4 nm). FIG. 10A(c) illustrates a case where the film thickness of the Co film 12B in the recording layer 10A is 5 Å (0.5 nm), and the film thickness of the CoB film 13 is 2 Å (0.2 nm). FIG. 10A(d) illustrates a case where the film thickness of the Co film 12B in the recording layer 10A is 2.5 Å (0.25 nm), and the film thickness of the CoB film 13 is 4 Å (0.4 nm). FIG. 10A(e) illustrates a case where the film thickness of the Co film 12B in the recording layer 10A is 2.5 Å (0.25 nm), and the film thickness of the CoB film 13 is 2 Å (0.2 nm).

The measurement results illustrated in FIG. 10A (b), (c), (d) and (e) show that the magnetic layer (recording layer) in the layered structure illustrated in FIG. 10A(a) has perpendicular magnetic anisotropy.

Figure 10B:
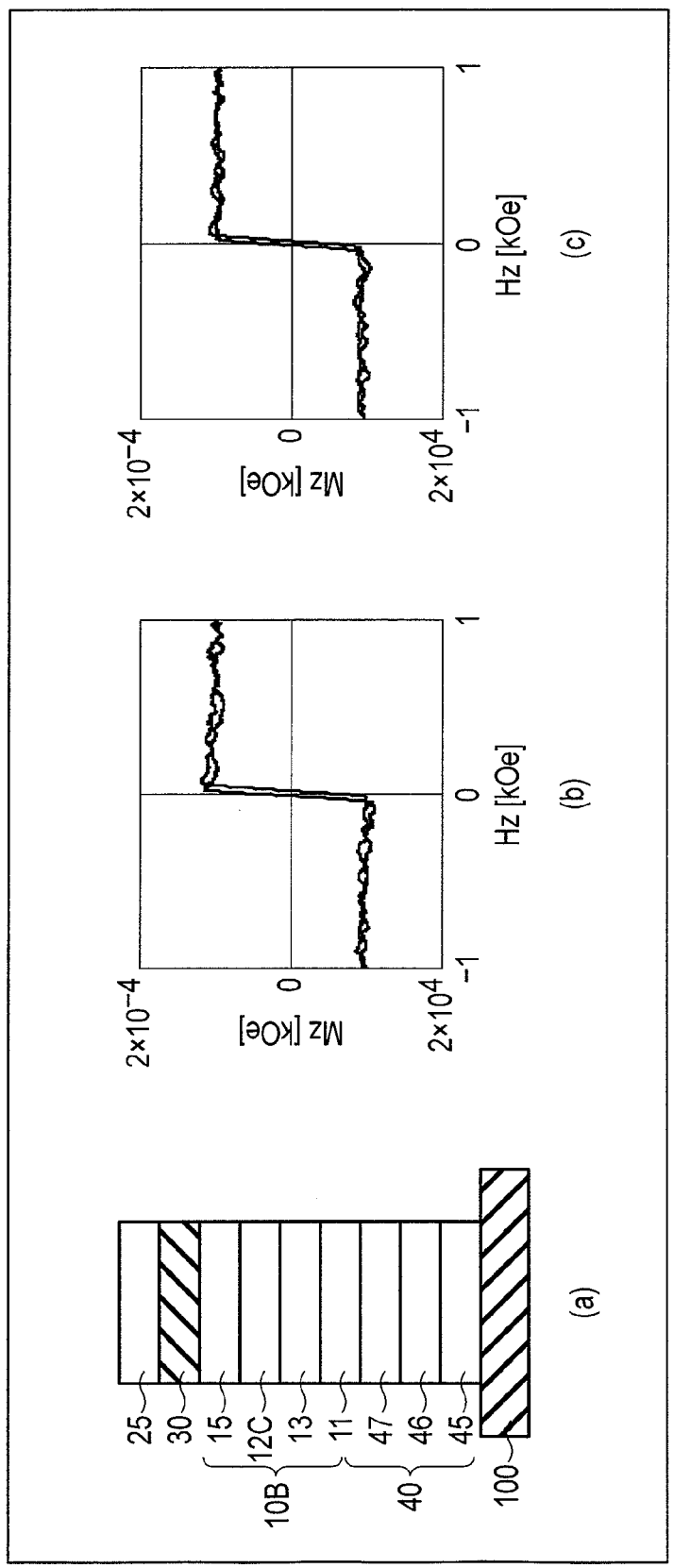
FIG. 10B is a view illustrating magnetic characteristics of a magnetic layer.

FIG. 10B illustrates magnetic characteristics of the recording layer 10B adopting a different structure from FIG. 10A (a).

The recording layer 10B illustrated in FIG. 10B(a) adopts a CoFeB/Ta/CoB/Pd structure. In this case, the Co film does not exist between the CoB film (second magnetic layer) 13 and Pd film 11, and the CoB film 13 is in contact with the Pd film 11. The structure in FIG. 10B(a) corresponds to the structure of iii) when the Pd film 11 is included in the recording layer, and corresponds to the structure of iv) when the Pd is included in the underlayer.

Similarly to the recording layer 10A in FIG. 10A, heating processing (at 325° C. for 30 minutes) is applied to the recording layer 10B in FIG. 10B.

FIG. 10B(b) illustrates a case where the film thickness of the CoB film 13 is 4 Å (0.4 nm), and FIG. 10B(c) illustrates a case where the film thickness of the CoB film 13 is 2 Å (0.2 nm).

The Ta film 12C is layered on the CoB film 13. The Ta film 12C has the film thickness of 3 Å (0.3 nm).

The recording layer 10B illustrated in FIG. 10B(a) also has perpendicular magnetic anisotropy of the magnetic layer.

Figure 10C:
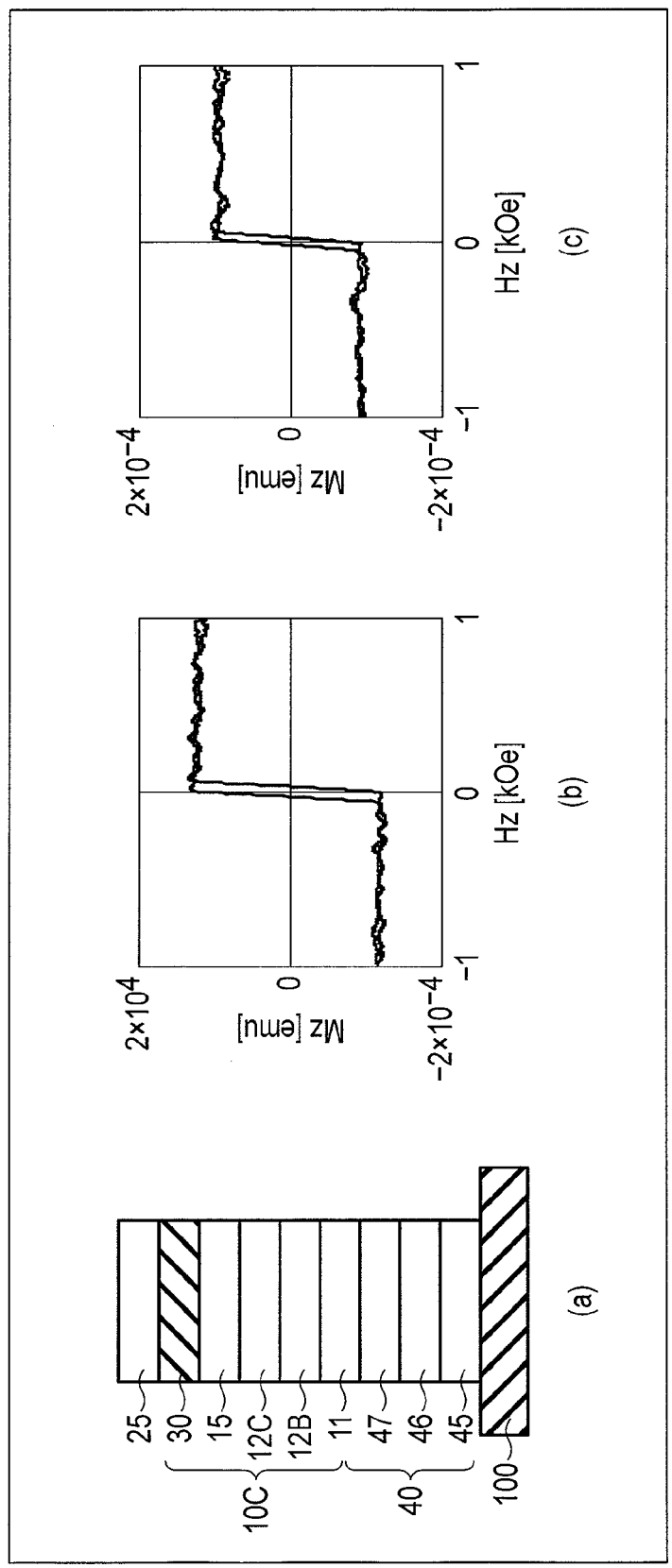
FIG. 10C is a view illustrating magnetic characteristics of a magnetic layer.

FIG. 10C illustrates magnetic characteristics of the recording layer adopting a different structure from FIG. 10A and FIG. 10B.

The recording layer 10C illustrated in FIG. 10C(a) adopts a CoFeB/Ta/Co/Pd structure. In this case, the CoB film does not exist between the Ta film 12C and Co film 12B, and the Co film 12B is in contact with the Ta film 12C. The structure in FIG. 10C(a) corresponds to the structure of v) when the Pd film 11 is included in the recording layer, and corresponds to the structure of vi) when the Pd film 11 is included in the underlayer.

After heating processing (at 325° C. for 30 minutes) is applied to the recording layer 10C, magnetic characteristics of the recording layer 10C are measured.

FIG. 10C(b) illustrates a case where the film thickness of the Co film 12B is 5 Å (0.5 nm), and FIG. 10C(c) illustrates a case where the film thickness of the Co film 12B is 2.5 Å (0.25 nm).

The recording layer 10C illustrated in FIG. 10C(a) also has perpendicular magnetic anisotropy as in FIG. 10A and FIG. 10B.

The recording layer 10D illustrated in FIG. 10D(a) adopts a CoFeB/Ta/Pd structure. In this case, the CoB film and Co film do not exist between the Ta film 12C and Pd film 11, and the Pd film 11 is in contact with the Ta film 12C. The structure of FIG. 10D(a) corresponds to the structure of vii).

Similarly to FIG. 10A to FIG. 10C, after heating processing (at 325° C. for 30 minutes) is applied to the recording layer 10D, magnetic characteristics of the recording layer 10D are measured.

As the structure of the recording layer 10D illustrated in FIG. 10D(a), even when the Co film and CoB film are not provided between the Pd film 11 and Ta film 12C in the recording layer 10D, a film (here, $Co_1Fe_9B$ film) including Co, Fe and B has perpendicular magnetic anisotropy as a substantial recording layer.

FIG. 10E illustrates magnetic characteristics of the recording layer adopting a different structure from FIG. 10A to FIG. 10D.

The recording layer 10E illustrated in FIG. 10E(a) adopts a CoFeB/Co/Pd structure. The interface layer 15 becomes the CoFeB film (first magnetic layer), and the insertion film (second magnetic layer) 12B becomes a Co film. The Co film of the insertion film 12B is provided on the Pd film 11.

Instead of the Co film, the CoFe film may be used as the insertion film (magnetic film) 12B. Meanwhile, when the CoFe film is used as the insertion film 12B, a material is preferably designed such that the composition of Co with respect to the composition of Fe included in the CoFe film 12B of the insertion film is greater than the composition of Co with respect to the composition of Fe included in the CoFeB film 15 of the interface layer 15.

The CoFeB film 15 is mainly used as a function layer for improving the MR ratio. Hence, a film with a good lattice match is preferably adjacent to the MgO film of the tunnel barrier layer 30. For example, bcc-Fe has a better lattice match to MgO than hcp-Co. Consequently, the CoFeB film 15 is preferably designed (the composition is adjusted) such that the composition of Fe of the CoFeB film 15 is greater than the composition of Co.

Further, the insertion film 12B is used as a function layer for improving perpendicular magnetic anisotropy of the recording layer (magnetic layer). When the CoFe film is used as the insertion film 12B, the magnitude of perpendicular magnetic anisotropy of Co is greater than Fe. Consequently, the CoFe film of the insertion film 12B is preferably designed such that the composition of Co included in the CoFe film is greater than the composition of Fe included in the CoFe film.

In the structure of the recording layer in FIG. 10E, in addition to CoFeB/CoFe, one of FeB/Co, FeB/CoFe and CoFeB/Co may be used instead of CoFeB/Co.

In addition, although FIG. 10A to FIG. 10E illustrate the magnetic layer in the structure including the Pd film in the underlayer or recording layer, even when both of the underlayer and recording layer do not include the Pd film and the recording layer without this Pd film is formed in contact on the Ir film, this recording layer has perpendicular magnetic anisotropy.

As illustrated in FIG. 10A to FIG. 10E, it is possible to form a perpendicular magnetization film having perpendicular magnetic anisotropy even in the magnetic body (recording layer) of the structures of i) to viii). Consequently, it is possible to use the magnetic layer in the structures of i) to vii) as the recording layer of the perpendicular magnetization type MTJ element.

(c-2) Underlayer

The underlayer used in the magnetoresistive effect element according to the present embodiment will be described.

An underlayer having an atom dense surface is preferably used to form the perpendicular magnetization film as the underlayer 40 of the MTJ element 1 according to the present embodiment. Hence, the underlayer 40 is preferably oriented toward the (0001) surface (a [0001] azimuth direction) of an hcp structure or a (111) surface (a [111] azimuth direction) of an fcc (face centered cubic) structure.

For example, from a viewpoint of heat resistance and lattice match, at least one material selected from a group of Pd, Ir, Pt, Ru, AlN or NbN is preferably used as the underlayer of the above recording layer.

In addition, the underlayer is not limited to a single layer structure of the above material, and may be a multilayer structure formed with a plurality of films. For example, a Pd/Ir structure, Ir/Ru structure or Pd/Ir/Ru structure is used for the underlayer 40 of the multilayer structure.

(c-3) Nonmagnetic Layer

The nonmagnetic layer used in the magnetoresistive effect element according to the present embodiment will be described.

For the nonmagnetic layer 10 of the MTJ element according to the present embodiment, for example, one of calcium oxide (CaO), strontium oxide (SrO), titanium oxide (TiO), vanadium oxide (VO) and niobium oxide (NbO) may be used instead of above MgO. MgO and these oxides adopt a sodium chloride (NaCl) structure.

When these oxides adopting the NaCl structure are used for the nonmagnetic layer (tunnel barrier layer), these films of the nonmagnetic layer are preferably oriented toward a (100) surface.

(c-4) Reference Layer

The reference layer used in the magnetoresistive effect element according to the present embodiment will be described.

A TbCoFe/CoFeB/Ta/CoFeB layer is illustrated as the reference layer 20 of the MTJ element according to the present embodiment. The TbCoFe/CoFeB/Ta/CoFeB layer is a perpendicular magnetization film.

A multilayer film formed with CoFeB/Ta/CoFeB is provided between the TbCoFe film and MgO film. The CoFeB/Ta/CoFeB layer is used as the interface layer in the reference layer 20. The CoFeB/Ta/CoFeB film contributes to improving the spin polarizability in the interface between the MgO film and reference layer 20, and obtaining a high MR ratio of the MTJ element.

According to heating processing, the Ta film sandwiched by the two CoFeB films prevents Tb in the TbCoFe film from being diffused toward the tunnel barrier layer (MgO film). Further, according to heating processing, the Ta film prevents crystallization of the TbCoFe film on the (001) surface. Thus, the Ta film between the two CoFeB films prevents deterioration of perpendicular magnetic anisotropy of the magnetic layer (reference layer) according to heating processing executed after formation of films to increase the MR ratio of the MTJ element.

Further, the structure is not limited to the TbCoFe/CoFeB/Ta/CoFeB structure, and, as long as a film or structure has perpendicular magnetic anisotropy, a reference layer of another material or structure may be used for the MTJ element according to the present embodiment.

For example, as a reference layer of the MTJ element, an artificial lattice film of Pt/Co, an FePt film of a $L1_0$ structure, cobalt-chrome-platinum (CoCrPt) film of an hcp structure, a rare earth-transition metal alloy (for example, $SmCo_5$) of an hcp structure or an Mn system ferrimagnetic body (for example, MnBi) may be used instead of a TbCoFe film in a multilayer structure of TbCoFe/CoFeB/Ta/CoFeB.

When the Pt/Co artificial lattice film is used for the reference layer 20, the Ta film sandwiched by the two CoFeB films prevents the crystalline-orientation of the CoFeB film which is in contact with the MgO film, toward surfaces other than the (100) surface.

Although the CoFeB film is illustrated in the interface layer in the reference layer 10, similarly to the interface layer of the recording layer 10, the composition ratio of the film may be adequately changed as long as the film is an alloy film including at least two of Co, Fe and B.

In addition, as described above, a material and structure described as the recording layer may be used as the reference layer.

(d) Conclusion

As described above, with the magnetoresistive effect element (MTJ element) according to the present embodiment, the recording layer is provided on the underlayer having the atom dense surface. By this means, the recording layer has magnetic anisotropy perpendicular to the film surface.

The recording layer 10 has the insertion films 12B and 12C selected from the Co film, Tb film, Ta film, Nb film, Mo film and W film. The Pd film 11 in the recording layer 10 functions as the underlayer for the film on the Pd film 11. According to the present embodiment, the density of the Pd film 11 of the underlayer is set to $3 \times 10^{15}$ atms/cm² or less.

The insertion films 12B and 12C prevent impurities (such as Pd) from being diffused toward the nonmagnetic layer (tunnel barrier layer) from the underlayer side. Further, the insertion films 12B and 12C lattice-match the nonmagnetic layer and the film (for example, interface layer) between the nonmagnetic layer and insertion film, and improve the crystallinity of these films. Consequently, the MR ratio of the magnetoresistive effect element improves.

Consequently, with the magnetoresistive effect element according to the first embodiment, it is possible to improve characteristics of the magnetoresistive effect element.

(2) Second Embodiment

The magnetoresistive effect element according to the second embodiment will be described using FIG. 11. In addition, the members of the magnetoresistive effect element according to the second embodiment substantially the same as in the magnetoresistive effect element according to the first embodiment will not be described in detail.

The magnetoresistive effect element according to the first embodiment is a top pin type MTJ element, and the reference layer is provided above the recording layer across the tunnel barrier layer.

By contrast with this, as illustrated in FIG. 11, the magnetoresistive effect element (MTJ element) 1C according to the second embodiment is a bottom pin type MTJ element. That is, in contrast to the first embodiment, with the MTJ element 1C according to the present embodiment, the reference layer 20 is provided below the recording layer 10 across the tunnel barrier layer 30.

In this case, the recording layer 10 is provided on the tunnel barrier layer 30, and therefore the layering orders i') to vii') for films for forming the recording layer according to the present embodiment is opposite to the above layering orders to vii). The details are as in i') to vii').

i') Pd/Co/CoFeB/Ta/CoFeB
ii') Co/CoFeB/Ta/CoFeB
iii') Pd/CoB/Ta/CoFeB
iv') CoB/Ta/CoFeB
v') Pd/Co/Ta/CoFeB
vi') Co/Ta/CoFeB
vii') Pd/Ta/CoFeB
viii') Pd/Co/CoFeB CoFeB in the lowermost layer of the recording layer 10 is provided on the tunnel barrier layer side, and the Co film or Pd film in the uppermost layer of the recording layer 10 is provided on the upper electrode side. In addition, the W film, Nb film or Mo film may be used instead of the Ta film, and the Tb film may be used instead of the Co film.

Similar to the first embodiment, with the MTJ element 1C according to the present embodiment, the recording layer 10 includes at least one film of a material selected from a group of the Co film, Ta film, W film, Nb film, Mo film or Tb film.

The Co film adopts a crystal structure corresponding to a surface space between 1.35 Å and 1.55 Å, and adopts, for example, a crystal structure of hcp (102) or bcc (001).

Further, the underlayer 40 may be provided between the upper electrode 52 and recording layer 10. Similarly to the first embodiment, with the MTJ element 1C according to the second embodiment, the underlayer (also referred to as "cap layer") 40 has the atom dense surface. Upon heating processing in a manufacturing process of the magnetoresistive effect element 1C according to the present embodiment, distortion occurs between the underlayer 40 having the atom dense surface and recording layer 10, and perpendicular magnetic anisotropy is given to the recording layer 10. Consequently, it is possible to form the recording layer 10 of a high thermal disturbance resistance.

Like the magnetoresistive effect element 1C according to the present embodiment illustrated in FIG. 11, in a case of a bottom pin type MTJ element adopting a structure in which the recording layer 10 is provided on the tunnel barrier layer 30, it is possible to obtain the same effect as the first embodiment.

Consequently, similarly to the magnetoresistive effect element according to the first embodiment, with the magnetoresistive effect element according to the second embodiment, it is possible to improve element characteristics of the perpendicular magnetization type magnetoresistive effect element.

(3) Third Embodiment

A magnetoresistive effect element according to the third embodiment will be described using FIG. 12. In addition, the members of the magnetoresistive effect element according to the third embodiment substantially the same as in the magnetoresistive effect element according to the first embodiment will not be described in detail.

A magnetoresistive effect element 1D according to the present embodiment differs from the magnetoresistive effect elements according to the first and second embodiments in providing a bias layer 59 adjacent to the reference layer 20. A nonmagnetic layer 58 is provided between the bias layer 59 and reference layer 20. The bottom surface (first surface) of the reference layer 20 is in contact with the tunnel barrier layer 30, and the upper surface (second surface) of the reference layer 20 is in contact with the nonmagnetic layer 58.

The bias layer 58 is a magnetic layer of perpendicular magnetization. For example, the orientation of magnetization of the bias layer 58 is opposite to the orientation of magnetization of the reference layer. The bias layer 58 prevents a magnetic coercive force (magnetic switching field) Hc of the recording layer 10 from being shifted and thermal stability from changing between a parallel state and non-parallel state of the directions of magnetization of the reference layer and magnetization of the recording layer due to the influence of a leak magnetic field (magnetostatic stray field) from the reference layer 20. A perpendicular magnetization film illustrated as the reference layer can be used for the material of the bias layer 58.

The material of the nonmagnetic layer 58 between the reference layer 20 and bias layer 59 is preferably selected from a material which forms a stable exchange bias when the orientation of magnetization of the reference layer 20 and the orientation of magnetization of the bias layer 59 are non-parallel. The material of the nonmagnetic layer 58 is preferably non-magnetic metal, and, for example, the material of the non-magnetic layer 58 is selected from Ru, silver (Ag) and Cu.

Further, to increase non-parallel coupling between the reference layer 20 and bias layer 59 across the nonmagnetic layer 58, magnetic layers (interface layers) such as CoFe, Co, Fe, CoFeB, CoB and FeB may be provided between the reference layer 20, the perpendicular magnetization film of the bias layer 59 and nonmagnetic layer 58 (for example, Ru).

By this means, it is possible to enhance non-parallel coupling between the reference layer 20 and bias layer 59.

Similarly to the first and second embodiments, with the MTJ element 1D according to the present embodiment, the recording layer 10 includes an insertion film selected from a group formed with the Co film, Tb film, Ta film, W film, Nb film and Mo film.

Further, similarly to the first and second embodiments, with the MTJ element 1C according to the third embodiment, the recording layer 10 is formed on the underlayer 40 having the atom dense surface.

Consequently, similarly to the magnetoresistive effect elements according to the first and second embodiments, with the magnetoresistive effect element according to the third embodiment, it is possible to improve element characteristics of the perpendicular magnetization type magnetoresistive effect element.

Application Example

An application example of the magnetoresistive effect element according to the first to third embodiments will be described with reference to FIG. 13 to FIG. 16.

The magnetoresistive effect element according to the above embodiment is used as a magnetic memory such as a memory element of an MRAM (Magnetoresistive Random Access Memory). With the present application example, the spin-torque transfer MRAM will be described.

(a) Configuration

FIG. 13 is a view illustrating a memory cell array of an MRAM and a circuit configuration near the memory cell array.

As illustrated in FIG. 13, a memory cell array 9 includes a plurality of memory cells MC.

The plurality of memory cells MC are arranged in the memory cell array 9 in an array pattern. In the memory cell array 9, a plurality of bit lines BL and bBL and a plurality of word lines WL are provided. The bit lines BL and bBL extend in a column direction, and the word lines WL extend in a row direction. Two bit lines BL and bBL form a pair of bit lines.

The memory cells MC are connected to the bit lines BL and bBL and word lines WL.

A plurality of memory cells MC aligned in the column direction are connected to the common pairs of bit lines BL and bBL. A plurality of memory cells MC aligned in the row direction are connected to common word lines WL.

The memory cell MC includes, for example, one magnetoresistive effect element (MTJ element) 1, and one or more selecting switches 2. For the MTJ element 1 in the memory cell MC, the magnetoresistive effect elements (MTJ elements) according to the first to third embodiments are used. Although a case will be described below where the MTJ element according to the first embodiment is used for an MRAM, it naturally follows that the MTJ elements according to the second and third embodiments may be used for an MRAM.

The selecting switch 2 is, for example, a field effect transistor. Hereinafter, the field effect transistor of the selecting switch 2 will be referred to as "select transistor 2".

One end of the MTJ element 1 is connected to the bit line BL, and the other end of the MTJ element 1 is connected to one end (source/drain) of a current path of the select transistor 2. The other end (drain/source) of the current path of the selecting transistor 2 is connected to the bit line bBL. A control terminal (gate) of the select transistor 2 is connected to the word line WL.

One end of the word line WL is connected to a row control circuit 4. The row control circuit 4 controls activation/deactivation of the word line based on an address signal from an outside.

One end and the other end of the bit lines BL and bBL are connected with column control circuits 3A and 3B. The column control circuits 3A and 3B control activation/deactivation of the bit lines based on an address signal from an outside.

Writing circuits 5A and 5B are connected to one end and the other end of bit lines through the column control circuits 3A and 3B. The writing circuits 5A and 5B each have a source circuit such as a current source or voltage source for generating a writing current Iw, and a sink circuit for absorbing the writing current Iw.

In the spin-torque transfer type MRAM, the writing circuits 5A and 5B supply the writing current Iw to a memory cell selected from an outside (hereinafter, selected cell) when data is written.

The writing circuits 5A and 5B bidirectionally apply the writing current Iw to the MTJ element 1 in the memory cell MC according to data to be written in the selected cell. That is, according to data to be written, the writing current Iw flowing from the bit line BL to the bit line bBL or the writing current Iw flowing from the bit line bBL to the bit line BL is output from the writing circuits 5A and 5B.

The reading circuits 6A and 6B are connected to one end and the other end of the bit lines BL and bBL through the column control circuits 3A and 3B. The reading circuits 6A and 6B include, for example, a voltage source or current source which generates a reading current, a sense amplifier which detects and amplifies a reading signal and a latch circuit which temporarily holds data. The reading circuits 6A and 6B supply reading currents to the selected cell when data is read. The current value of the reading current is smaller than the current value (inversion threshold) of the writing current Iw such that the magnetization of the recording layer is not inverted due to the reading current.

According to the magnitude of the resistance value of the MTJ element 1 to which the reading current is supplied, the current value or potential in a reading node varies. Based on the variation amount matching the magnitude of this resistance value, data which the MTJ element 1 stores is decided.

In addition, although the reading circuits 6A and 6B are provided at both ends in the column direction with the example illustrated in FIG. 13, one reading circuit may be provided only at one end.

FIG. 14 is a sectional view illustrating an example of a structure of the memory cells MC provided in the memory cell array 9.

The memory cells MC are formed in active areas AA of a semiconductor substrate 70. The active areas AA are partitioned by an insulating film 71 embedded in an element isolation area of the semiconductor substrate 70.

The upper end of the MTJ element 1 is connected to a bit line 76 (BL) through the upper electrode 52. Further, the lower end of the MTJ element 1 is connected to a source/drain diffusing layer 64 of the select transistor 2 through the lower electrode 51 and a contact plug 72B. A source/drain diffusing layer 63 of the select transistor 2 is connected to a bit line 75 (bBL) through a contact plug 72A.

On the surface of the active area AA between the source/drain diffusing layer 64 and source/drain diffusing layer 63, a gate electrode 62 is formed across a gate insulating film 61. The gate electrode 62 extends in the row direction and is used as the word line WL.

In addition, although the MTJ element 1 is provided immediately above the plug 72B, the MTJ element 1 may be arranged in a position displaced from immediately above the contact plug (for example, above the gate electrode of the selecting transistor) using an intermediate interconnect layer.

FIG. 14 illustrates an example where one memory cell is provided in one active area AA. However, two memory cells may be provided in one active area AA to be adjacent in the column direction such that the two memory cells share one bit line bBL and source/drain diffusing layer 23. By this means, the cell size of the memory cell MC is reduced.

Although the select transistor 2 is a field effect transistor of a planar structure in FIG. 14, the structure of the field effect transistor is not limited to this. For example, a field effect transistor of a three dimensional structure such as RCAT (Recess Channel Array Transistor) or FinFET may be used as a select transistor. An RCAT adopts a structure in which a gate electrode is embedded in a recess in a semiconductor area across the gate insulating film. A FinFET adopts a structure in which gate electrodes make grade crossings in a semiconductor area (fin) of a reed shape across the gate insulating film. Further, the memory cell MC may include two select transistors, and the two select transistors may be connected for one MTJ element.

As described in the first to third embodiments, with the magnetoresistive effect element (MTJ element) according to each embodiment, it is possible to improve the MR ratio of the MTJ element.

That is, a difference is great between a resistance value of the MTJ element in a low resistant state (parallel state) and a resistance value of the MTJ element in a high resistant state (non-parallel state). Therefore, the difference is great between the fluctuation amounts of potentials or currents in two stationary states. As a result, it is possible to reliably read data stored in the MTJ element of the memory element. Consequently, with an MRAM which employs the MTJ element according to the present embodiment, it is possible to improve the reliability to read data in an MRAM.

(b) Manufacturing Method

A method of manufacturing memory cells in an MRAM according to the present application example will be described using FIGS. 15 and 16.

FIGS. 15 and 16 each illustrate the sectional surface of the memory cell MC along the column direction in each manufacturing process of MRAM.

As illustrated in FIG. 15, for example, the isolation insulating film 71 of an STI (Shallow Trench Isolation) structure is embedded in the semiconductor substrate 70 to form the element isolation area. By forming this element isolation area, the active areas AA are partitioned in the semiconductor substrate 70.

Further, the select transistor 2 of the memory cell MC is formed on the active area AA of the semiconductor substrate 70. The process of forming the select transistor is as follows.

The gate insulating film 61 is formed on the surface of the active area AA. The gate insulating film 61 is formed by, for example, a thermal oxidation method. The gate insulating film 61 is, for example, a silicone oxidized film. Next, a conductive layer (for example, polysilicon layer) is formed on the gate insulating film 21 by, for example, a CVD (Chemical Vapor Deposition) method.

The conductive layer is processed in a predetermined pattern using, for example, a photolithography technique and RIE (Reactive Ion Etching) method. By this means, the gate electrode 62 is formed on the gate insulating film 61. The gate electrode 62 is formed to extend in a row direction to use the gate electrode 62 as the word line. Hence, the gate electrode 62 is shared between a plurality of select transistors aligned along the row direction.

The source/drain diffusing layers 63 and 64 are formed in the semiconductor substrate 70. The diffusing layers 63 and 64 are formed by injecting impurities such as arsenic (As) and phosphorus (P) into the semiconductor substrate 70 by an ion plantation method using the gate electrode 62 as a mask.

According to the above process, the selecting transistor 2 is formed on the semiconductor substrate 70. In addition, a process of forming a silicide layer on the upper surfaces of the gate electrode 62 and diffusing layers 63 and 64 may be further added.

A first interlayer insulating film 79A is deposited on the semiconductor substrate 70 to cover the selecting transistor 2 using, for example, the CVD method. The upper surface of the interlayer insulating film 33 is planarized using the CMP (Chemical Mechanical Polishing) method.

A contact hole is formed in the interlayer insulating film 79A such that the upper surface of the source/drain diffusing layer 63 is exposed. For example, tungsten (W) or molybdenum (Mo) is filled in the formed contact hole to form the contact plug 72A.

The metal film is deposited on the interlayer insulating film 79A and contact plug 72. The deposited metal film is processed in a predetermined shape using the photolithography technique and RIE method. By this means, the bit line 75 (bBL) to be connected to the current path of the select transistor 2 is formed.

Then, a second interlayer insulating film 79B is deposited on the interlayer insulating film 79A and bit line 75B using, for example, the CVD method. Further, a contact hole is formed in the interlayer insulating films 79A and 79B such that the surface of the source/drain diffusing layer 64 is exposed. In this contact hole, the contact plug 72B is embedded by the sputtering method or CVD method.

As illustrated in FIG. 16, the components of the magnetoresistive effect element according to the present embodiment are sequentially deposited on the interlayer insulating film 79B and contact plug 72B. For example, when the MTJ element 1A according to the first embodiment is used for an MRAM, the components of the element are deposited in the order described below.

An electrode member for forming the lower electrode of the MTJ element is deposited on the interlayer insulating film 79B and contact plug 72B by, for example, the sputtering method.

The underlayer 40 is deposited on the electrode member. The underlayer 40 has the atom dense layer. One of a Pd film, Ir/Ru layer and Pd/Ir/Ru layer is used for the underlayer 40.

The magnetic layer for forming the recording layer 10 is deposited on the underlayer 40 by, for example, the sputtering method. The magnetic layer for forming the recording layer adopts a multilayer structure and adopts, for example, a structure of CoFeB/Ta/CoFeB/Co/Pd. In addition, the Pd film in the lowermost layer also functions as the underlayer. When the Pd film is used for the underlayer 40, the Pd film in the lowermost layer of the recording layer may not be deposited. The CoFeB/Ta/CoFeB layer in the recording layer 10 functions as the interface layer. One of a FeB film and CoFe film may be used instead of the CoFeB films 13 and 15 of the interface layer. In addition, different compositions and materials may be used for the two CoFeB films sandwiching the Ta film in the interface layer in each other.

Instead of the CoFeB/Ta/CoFeB/Co/Pd layer, the magnetic layer (structure) described in FIG. 10A to FIG. 10E may be used in the recording layer 10.

The nonmagnetic layer (tunnel barrier layer) 30 is deposited on the magnetic layer 10 by, for example, the spattering method or CVD method. The nonmagnetic layer 30 is, for example, an MgO film.

The magnetic layer 20 for forming the reference layer 20 is deposited on the nonmagnetic layer 30. The magnetic layer 20 of the reference layer adopts a multilayer structure and adopts, for example, a TbCoFe/CoFeB/Ta/CoFeB layer. The artificial lattice film or film of the $L1_0$ structure may be used in the reference layer.

An electrode member for forming the upper electrode of the MTJ element is deposited on the magnetic layer 20 by the spattering method.

When the MTJ element includes a bias layer, the nonmagnetic layer (for example, metal film) is deposited and then the bias layer is deposited on magnetic layer 20 before the electrode member for the upper electrode is deposited.

In addition, although a process of manufacturing the top pin type MTJ element is described, the bottom pin type MTJ element may be formed in the memory cell. With the process of forming the bottom pin type MTJ element, the order to deposit films included in the MTJ element is simply opposite to the process of forming the top pin type MTJ element, and the forming process is substantially the same as the process of forming the top pin type MTJ element.

Further, the MTJ element is processed into a predetermined shape using the photolithography technique and RIE method. Further, heating processing is applied to component films of the MTJ element to improve the crystallinity (element characteristics). This heating processing may be executed before processing of the MTJ element or may be executed after processing.

As described in the first to third embodiments, when the Co film in the recording layer 10 is formed on the underlayer (Pd film or Ir film) having the atom dense surface, this Co film has a surface space of 1.35 Å to 1.55 Å in the film sectional surface direction (in-film surface direction), and adopts a crystal structure of an hcp (102) surface or bcc (001) surface. By this means, it is possible to improve the orientation of a (110) surface of the CoFeB film layered on the Co film or (100) surface ({100} surface) of the MgO film. As a result, it is possible to improve element characteristics of the MTJ element 1A.

Further, after the MTJ element is processed, the third interlayer insulating film (for example, $SiO_2$) 79 is formed using, for example, the CVD method. While the interlayer insulating film 79C is deposited, the processed MTJ element 1A is exposed to, for example, the temperature equal to or more than 300° C.

As described above, the insertion film 12 such as a Co film or Ta film is provided between the Pd film and tunnel barrier layer 30 (for example, MgO film). Consequently, Pd is prevented from being diffused to the vicinity of the tunnel barrier layer 30. Hence, even if a high temperature process is included in a process of manufacturing an MRAM, deterioration of characteristics (for example, MR ratio) of the MTJ element 1A according to the present embodiment is prevented.

Then, the bit line BL is formed on the interlayer insulating film 79.

According to the above manufacturing process, a memory cell of an MRAM according to the application example is formed.

As described using FIGS. 13 to 16, the magnetoresistive effect element (MTJ element) according to the present embodiment is applicable to an MRAM.

An MRAM according to the present application example can improve the operation characteristics and reliability of a memory by using the magnetoresistive effect element according to the present embodiment.

[Other]

The magnetoresistive effect element according to the first to third embodiments can improve element characteristics.

In addition, although an example has been described as the application example of the present embodiment where the magnetoresistive effect element according to the embodiments is used for an MRAM, the present embodiment is not limited to this, and may be applied to other memories (for example, a ROM using a magnetoresistive effect element) or devices.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistive effect element comprising:
a recording layer comprising ferromagnetic material with perpendicular magnetic anisotropy to a film surface and a variable orientation of magnetization;
a reference layer comprising ferromagnetic material with perpendicular magnetic anisotropy to a film surface and an invariable orientation of magnetization;
a nonmagnetic layer between the recording layer and the reference layer;
a first underlayer on a side of the recoding layer opposite to a side on which the nonmagnetic layer is provided; and
a second underlayer between the recording layer and the first underlayer,
wherein
the second underlayer is a Pd film including a concentration of $3 \times 10^{15}$ atms/cm$^2$.

2. The magnetoresistive effect element according to claim 1, wherein
the recording layer comprises:
a first magnetic layer including at least two of Co, Fe and B; and
an insertion film selected from a group including Ta, Nb, Mo and W, and
wherein the first magnetic layer is arranged on a side of the nonmagnetic layer, and the insertion layer is arranged on a side of the second underlayer.

3. The magnetoresistive effect element according to claim 2, wherein
the recording layer further comprises a second magnetic layer including at least one of Co and Tb, and
the second magnetic layer is provided between the second underlayer and the insertion film.

4. The magnetoresistive effect element according to claim 3, wherein
when the second magnetic layer is a Co film, the Co film comprises a distance between atomic layers equal to or more than 1.35 Å and equal to or less than 1.55 Å in an in-film surface direction.

5. The magnetoresistive effect element according to claim 2, wherein
the insertion film is oriented toward a bcc {001} surface.

6. The magnetoresistive effect element according to claim 2, wherein
the first magnetic layer is oriented toward a bcc {100} surface.

7. The magnetoresistive effect element according to claim 2, wherein
the first magnetic layer includes Co and Fe, and
a concentration of the Fe in the first magnetic layer is higher than a concentration of the Co in the first magnetic layer.

8. The magnetoresistive effect element according to claim 1, wherein
the recording layer comprises:
a first magnetic layer including at least two of Co, Fe and B;
an insertion film selected from a group including Ta, Nb, Mo and W;
a second magnetic layer including at least one of Co and Tb; and
a third magnetic layer including at least two of Co, Fe and B,
wherein the first magnetic layer is arranged on the side of the nonmagnetic layer,
the second magnetic layer is arranged on a side of the second underlayer,
the insertion film is arranged on a side of the first magnetic layer between the first magnetic layer and the second magnetic layer, and
the third magnetic layer is arranged on a side of the second magnetic layer between the first magnetic layer and the second magnetic layer.

9. The magnetoresistive effect element according to claim 8, wherein
when the second magnetic layer is a Co film, the Co film comprises a distance between atomic layers equal to or more than 1.35 Å and equal to or less than 1.55 Å in an in-film surface direction.

10. The magnetoresistive effect element according to claim 8, wherein
the insertion film is oriented toward a bcc {001} surface.

11. The magnetoresistive effect element according to claim 1, wherein
the recording layer comprises:
a first magnetic layer including at least two of Co, Fe and B; and
a second magnetic layer including at least one of Co and Fe,
wherein the first magnetic layer is arranged on a side of the nonmagnetic layer, and the second magnetic layer is arranged on a side of the second underlayer.

12. The magnetoresistive effect element according to claim 11, wherein
when the first magnetic layer is a CoFeB film and the second magnetic layer is CoFe, a concentration of Fe in the first magnetic layer is higher than a concentration of Fe in the second magnetic layer.

13. The magnetoresistive effect element according to claim 11, wherein
when the second magnetic layer is a Co film, the Co film comprises a distance between atomic layers equal to or more than 1.35 Å and equal to or less than 1.55 Å in an in-film surface direction.

14. The magnetoresistive effect element according to claim 1, wherein
the recording layer comprises:
a first magnetic layer on a side of the nonmagnetic layer; and
a second magnetic layer on a side of the second underlayer,
wherein the first magnetic layer is $(Co_xFe_{100-x})_{100-z}B_z$ (x≤75 atomic % and 0≤z≤30 atomic %), and the second magnetic film is $(Co_wFe_{100-w})_{100-z}B_z$ (0≤z≤30 atomic % and x<w).

15. The magnetoresistive effect element according to claim 1, wherein
the first underlayer comprises an atom dense surface.

16. The magnetoresistive effect element according to claim 1, wherein
the first underlayer is selected from a group including an Ir, Pt, Ru, AlN and NbN.

17. A magnetic memory comprising:
a memory cell comprising the magnetoresistive effect element according to claim 1.

18. The magnetic memory according to claim 17, wherein
the recording layer comprises:
a first magnetic layer including at least two of Co, Fe and B; and
at least one insertion film selected from a group including Ta, Nb, Mo and W,
wherein the first magnetic layer is arranged on a side of the first nonmagnetic layer, and the insertion layer is arranged on a side of the second underlayer.

19. The magnetic memory according to claim 18, wherein
the insertion film is oriented toward a bcc {001} surface.

20. The magnetic memory according to claim 17, wherein
the first underlayer comprises an atom dense surface.

* * * * *